(12) United States Patent
Lee et al.

(10) Patent No.: US 11,877,485 B2
(45) Date of Patent: Jan. 16, 2024

(54) ELECTRONIC COMPONENT, ELECTRIC DEVICE INCLUDING THE SAME

(71) Applicant: Samsung Display Co., Ltd., Yongin-Si (KR)

(72) Inventors: Chung-seok Lee, Hwaseong-si (KR); Joonsam Kim, Hwaseong-si (KR); Chulho Jung, Daegu (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/315,456

(22) Filed: May 10, 2021

(65) Prior Publication Data

US 2021/0265455 A1 Aug. 26, 2021

Related U.S. Application Data

(63) Continuation of application No. 16/870,812, filed on May 8, 2020, now Pat. No. 11,031,454, which is a
(Continued)

(30) Foreign Application Priority Data

Aug. 22, 2017 (KR) ........................ 10-2017-0106276

(51) Int. Cl.
*H01L 27/12* (2006.01)
*H01K 1/14* (2006.01)
(Continued)

(52) U.S. Cl.
CPC ......... *H10K 59/131* (2023.02); *H01L 23/544* (2013.01); *H01L 27/1262* (2013.01);
(Continued)

(58) Field of Classification Search
CPC . H01L 23/544; H01L 23/528; H01L 23/5386; H01L 23/5387; H01L 23/13;
(Continued)

(56) References Cited

U.S. PATENT DOCUMENTS 7,403,257 B2 7/2008 Shin et al.
7,586,576 B2 9/2009 Park et al.
(Continued)

FOREIGN PATENT DOCUMENTS

CN 101996531 A 3/2011
CN 103152979 A 6/2013
(Continued)

OTHER PUBLICATIONS

Korean Notice of Allowance corresponding to Application No. 10-2017-0106276 and dated Sep. 28, 2022, 3 pages.

*Primary Examiner* — Nikolay K Yushin
(74) *Attorney, Agent, or Firm* — Innovation Counsel LLP

(57) ABSTRACT

Provided is an electronic device including a display panel including a base substrate, pixels, a first insulation layer, and panel pads spaced along a first direction from pixels and each arranged along a second direction crossing the first direction, a circuit board disposed on the display panel and connected to panel pads, and an adhesive interconnect layer disposed between the display panel and the circuit board and electrically connecting the display panel and the circuit board. The circuit board includes a flexible substrate including a top surface facing the base substrate, output pads disposed on the flexible substrate and connected to panel pads, each obliquely extending in the first and second directions and arranged along the second direction, an alignment pad spaced along the second direction from
(Continued)

output pads, and a stress relaxation pad disposed between output pads and alignment pads and electrically insulated from panel pads.

27 Claims, 18 Drawing Sheets

Related U.S. Application Data continuation of application No. 15/970,902, filed on May 4, 2018, now Pat. No. 10,651,260.

(51) Int. Cl.
| | |
|---|---|
| *H01L 23/34* | (2006.01) |
| *H10K 59/131* | (2023.01) |
| *H05K 1/14* | (2006.01) |
| *H05K 1/11* | (2006.01) |
| *H01L 23/544* | (2006.01) |
| *H05K 1/02* | (2006.01) |
| *H10K 59/123* | (2023.01) |
| *H10K 59/124* | (2023.01) |
| *H10K 59/121* | (2023.01) |
| *H01L 23/00* | (2006.01) |
| *H10K 102/00* | (2023.01) |

(52) U.S. Cl.
CPC ........... *H05K 1/0271* (2013.01); *H05K 1/118* (2013.01); *H05K 1/147* (2013.01); *H10K 59/123* (2023.02); *H10K 59/124* (2023.02); *H10K 59/1213* (2023.02); *H01L 24/29* (2013.01); *H01L 24/32* (2013.01); *H01L 27/124* (2013.01); *H01L 27/1248* (2013.01); *H01L 2223/5442* (2013.01); *H01L 2223/54426* (2013.01); *H01L 2223/54486* (2013.01); *H01L 2224/2929* (2013.01); *H01L 2224/32227* (2013.01); *H01L 2924/1304* (2013.01); *H05K 2201/041* (2013.01); *H05K 2201/09136* (2013.01); *H05K 2201/09781* (2013.01); *H05K 2201/10128* (2013.01); *H05K 2201/10977* (2013.01); *H05K 2203/166* (2013.01); *H10K 2102/351* (2023.02)

(58) Field of Classification Search
CPC ......... H01L 24/29; H01L 24/32; H01L 24/06; H01L 24/78; H01L 24/82; H01L 27/3248; H01L 27/3262; H01L 27/3258; H01L 27/3276; H01L 27/1262; H01L 27/124; H01L 27/1248; H01L 2224/2929; H01L 2224/32227; H01L 2223/54426; H01L 2223/5442; H01L 2223/5448; H01L 2251/558; H01L 2924/1304; H01L 2924/00012; H05K 1/0271; H05K 1/147; H05K 1/118; H05K 2203/166; H05K 2201/09136; H05K 2201/041; H05K 2201/09781; H05K 2201/10128; H05K 2201/10977; H05K 59/131; H05K 59/1213; H05K 59/124; H05K 59/123

See application file for complete search history.

(56) References Cited

U.S. PATENT DOCUMENTS

| | | | |
|---|---|---|---|
| 9,059,162 B2 | 6/2015 | Ha et al. | |
| 9,232,633 B2 | 1/2016 | Kim | |
| 9,281,346 B1 | 3/2016 | Lim et al. | |
| 9,572,248 B2 | 2/2017 | Lee | |
| 9,609,758 B2 | 3/2017 | Jeong et al. | |
| 9,652,103 B2* | 5/2017 | Kurasawa | G02F 1/13338 |
| 9,703,134 B2 | 7/2017 | Nakano | |
| 9,775,248 B2* | 9/2017 | Kim | H05K 1/111 |
| 9,936,591 B2 | 4/2018 | Kim et al. | |
| 10,651,260 B2 | 5/2020 | Lee et al. | |
| 2011/0032687 A1 | 2/2011 | Song | |
| 2011/0199569 A1 | 8/2011 | Matsui et al. | |
| 2012/0006584 A1 | 1/2012 | Matsui et al. | |
| 2016/0242295 A1* | 8/2016 | Kim | H05K 1/111 |
| 2016/0291723 A1* | 10/2016 | Kurasawa | G02F 1/13338 |
| 2016/0351474 A1 | 12/2016 | Dote et al. | |
| 2017/0047547 A1 | 2/2017 | Son et al. | |
| 2017/0069253 A1 | 3/2017 | Jang et al. | |

FOREIGN PATENT DOCUMENTS

| | | |
|---|---|---|
| CN | 103872077 A | 6/2014 |
| CN | 106879172 A | 6/2017 |
| JP | 6143466 B2 | 6/2017 |
| KR | 10-0724479 B1 | 6/2007 |
| KR | 10-2012-0033689 A | 4/2012 |
| KR | 10-2012-0075114 A | 7/2012 |
| KR | 10-1171178 B1 | 7/2012 |
| KR | 10-2015-0054454 A | 5/2015 |
| KR | 10-2015-0117999 A | 10/2015 |
| KR | 10-2016-0087975 A | 7/2016 |
| KR | 10-20160085038 A | 7/2016 |
| KR | 10-2017-0006461 A | 1/2017 |
| KR | 10-20170080211 A | 7/2017 |

* cited by examiner

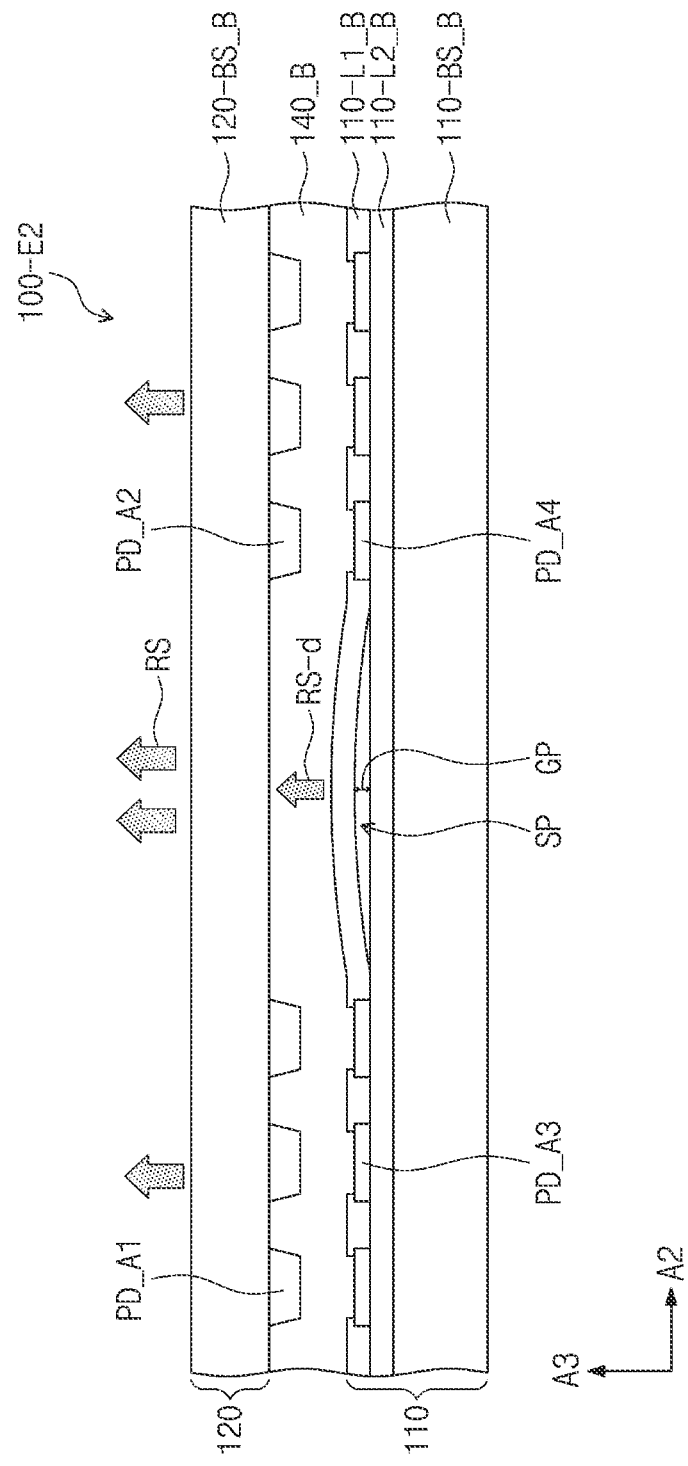

# US 11,877,485 B2

ELECTRONIC COMPONENT, ELECTRIC DEVICE INCLUDING THE SAME

CROSS-REFERENCE TO RELATED APPLICATIONS

This U.S. non-provisional patent application claims priority under 35 U.S.C. § 119 of Korean Patent Application No. 10-2017-0106276, filed on Aug. 22, 2017, the entire contents of which are hereby incorporated by reference.

BACKGROUND

The present disclosure herein relates to an electronic component and an electronic device including the same, and more particularly, to an electronic component having improved reliability in a manufacturing process and an electronic device including the electronic component.

In general, an electronic device includes two or more electronic components. For example, electronic device such as a mobile phone, a laptop computer and a television includes an electro-optical panel generating an image, a main wiring substrate, and a flexible wiring substrate.

Two electronic components are electrically connected through the connection of pads. The pad portions of the two electronic components are bonded through an alignment step, and may be bonded by using a thermo-compression bonding tool and the like.

The pad portions of the two electronic components may have a size different from a design size, due to a manufacturing error. In addition, the two electronic components may be shrunk or expanded due to the heat generated in the bonding process. Further, delamination and the like may occur due to the difference in resilience between electronic components after the bonding process. The reliability in electrical connection of the electronic components is lowered for the same reason as described above.

SUMMARY

Therefore, the present disclosure is directed to providing an electronic component in which the reliability of electrical connection is improved, and an electronic device including the electronic component.

An embodiment of the inventive concept provides an electronic device including: a display panel including a base substrate, a plurality of pixels disposed on the base substrate, a first insulation layer disposed on the base substrate and including an organic material, and a plurality of panel pads, at least a portion of the plurality of panel pads being partially exposed by the first insulation layer, the plurality of panel pads being spaced apart in a first direction from the pixels, and each of the plurality of panel pads being arranged along a second direction crossing the first direction; a circuit board disposed on the display panel and connected to the plurality of panel pads; and an adhesive interconnect layer disposed between the display panel and the circuit board and electrically connecting the display panel and the circuit board.

In an embodiment, the circuit board may include a flexible substrate having a top surface facing the base substrate; a plurality of output pads which are disposed on the flexible substrate and connected to the plurality of panel pads, each of which extends obliquely with respect to the first direction and the second direction, and which are arranged along the second direction; an alignment pad spaced apart along the second direction from the output pads; and a stress relaxation pad disposed between the output pads and the alignment pad, and electrically insulated from the plurality of panel pads.

In an embodiment, the output pads may overlap the plurality of panel pads, and the stress relaxation pad may not overlap the plurality of panel pads in a plan view.

In an embodiment, the adhesive interconnect layer may be in contact with the first insulation layer in an area in which, in a plan view, the adhesive interconnect layer overlap the stress relaxation pad in a plan view.

In an embodiment, the adhesive interconnect layer may include an adhesive layer, and a plurality of conductive particles dispersed in the adhesive layer, the adhesive layer and the first insulation layer being in contact with each other in an area overlapping the stress relaxation pad.

In an embodiment, the electronic device may further include a second insulation layer disposed between the first insulation layer and the base substrate, wherein the adhesive force between the first insulation layer and the adhesive layer is greater than the adhesive force between the first insulation layer and the second insulation layer.

In an embodiment, the stress relaxation pad may include a plurality of sub-pads which are arranged apart from each other along the second direction.

In an embodiment, the sub-pads may extend in a direction parallel to the output pads.

In an embodiment, the output pads may have predetermined extension angles with respect to the first direction, and at least two pads of the output pads may have different extension angles.

In an embodiment, the sub-pads may extend in a direction parallel to an output pad closest to the sub-pads among the output pads.

In an embodiment, the sub-pads may extend in a direction crossing the output pads.

In an embodiment, the stress relaxation pad may be disposed on the same layer as the output pads, and may include the same material as the output pads.

In an embodiment, the length in the first direction of the stress relaxation pad may be greater than or equal to the length in the first direction of the alignment pad, and may be less than or equal to the lengths in the first direction of the output pads.

In an embodiment, the display panel may further include an additional alignment pad disposed on the base substrate and spaced apart from the alignment pad in second direction, wherein the stress relaxation pad may be spaced apart from the alignment pad, the output pad, and the additional alignment pad.

In an embodiment, the display panel may further include a window pad spaced apart from the plurality of panel pads and overlapping the stress relaxation pad and a portion of the first insulation layer overlapping the widow pad may be removed.

In an embodiment, each of the pixels may include a thin film transistor disposed on base substrate and a pixel electrode connected to the thin film transistor, the first insulation layer may be disposed between the thin film transistor and the pixel electrode, and the pixel electrode contacts the thin film transistor through a contact hole formed in the first insulation layer.

In an embodiment of the inventive concept, an electronic component includes a flexible substrate including one side extending along a first direction; an electronic element disposed on the flexible substrate; a plurality of output pads disposed adjacent to the one side and spaced apart from the electronic element in a second direction crossing the first direction, each of the plurality of output pads being spaced apart from each other along the first direction and extending obliquely with respect to each of the first direction and the second direction; an alignment pad spaced apart in the first direction from the output pads; and a stress relaxation pad disposed between the output pads and the alignment pad, and electrically insulated from the output pads.

In an embodiment, the stress relaxation pad may include a plurality of sub-pads extending obliquely with respect to each of the first direction and the second direction, and the plurality of sub-pads are spaced apart from the output pads and the alignment pad in a plan view.

In an embodiment, the sub-pads may be parallel to at least any one of the output pads.

In an embodiment, the length in the second direction of the stress relaxation pad may be greater than or equal to the length of the alignment pad in the second direction, and is less than or equal to the lengths of the pads in the second direction.

In an embodiment, the stress relaxation pad may be disposed in the same layer as the output pads, and may include the same material as the output pads.

BRIEF DESCRIPTION OF THE FIGURES

The accompanying drawings are included to provide a further understanding of the inventive concept, and are incorporated in and constitute some of this specification. The drawings illustrate exemplary embodiments of the inventive concept and, together with the description, serve to explain principles of the inventive concept. In the drawings:

FIG. 7A and FIG. 7B are cross-sectional views of a part of an electronic device according to a comparative example;

DETAILED DESCRIPTION

Hereinafter, an electronic device according to an embodiment of the inventive concept will be described in detail with reference to the accompanying drawings. Meanwhile, in describing a direction herein, one direction and opposite direction thereto are described as the same direction.

Figure 1:
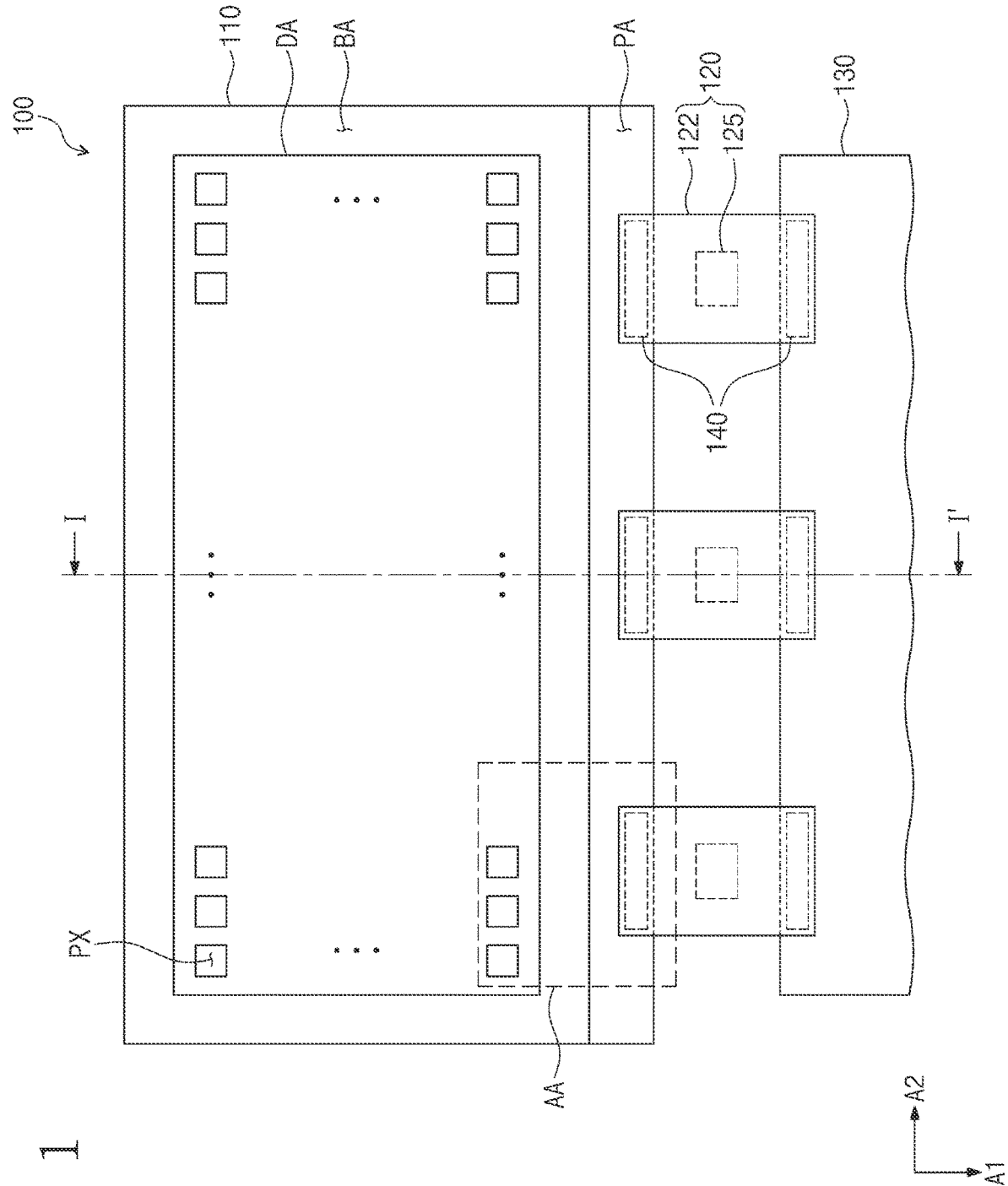
FIG. 1 is a plan view illustrating a part of the electronic device according to an embodiment of the inventive concept.
Figure 2:
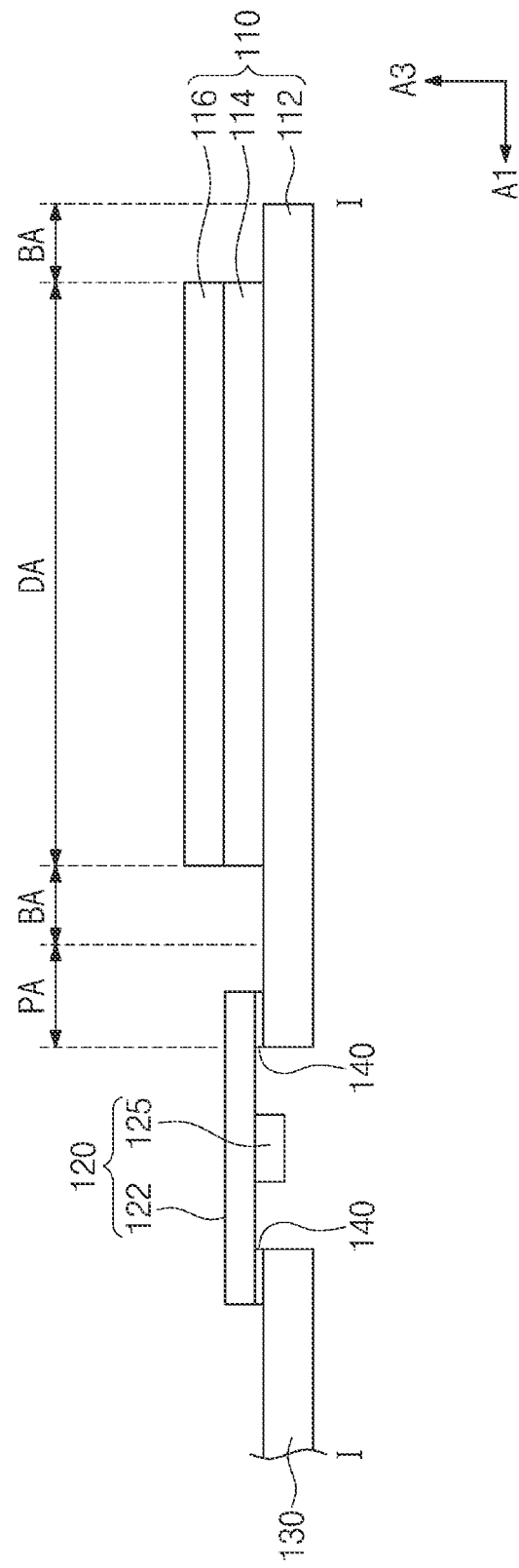
FIG. 2 is a cross-sectional view taken along line I-I' illustrated in FIG. 1.
Figure 3A:
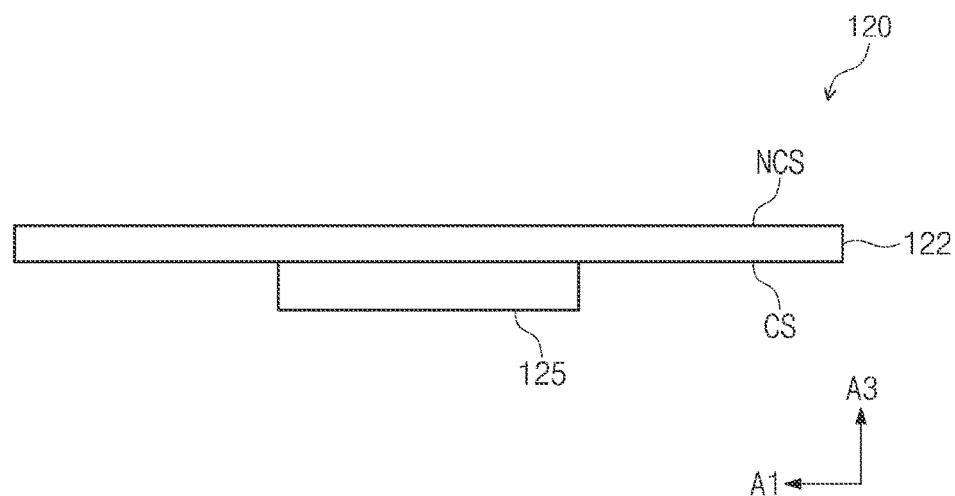
FIG. 3A and FIG. 3B are a cross-sectional view and a plan view illustrating the configuration of the part illustrated in FIG. 1, respectively.
Figure 3B:
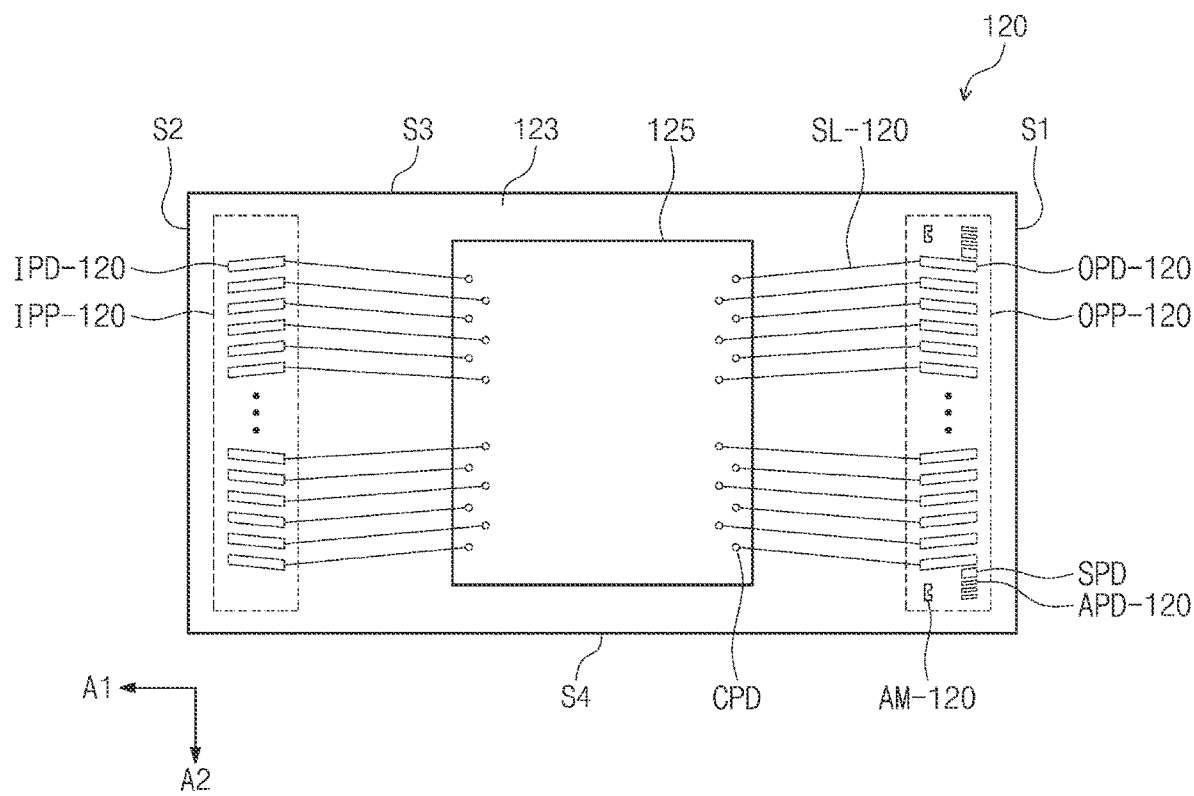

FIG. 1 is a plan view illustrating a part of the electronic device according to an embodiment of the inventive concept. FIG. 2 is a cross-sectional view taken along line I-I' illustrated in FIG. 1. FIG. 3A and FIG. 3B are a cross-sectional view and a plan view illustrating the configuration of the part illustrated in FIG. 1, respectively. Hereinafter, an electronic device 100 according to an embodiment of the inventive concept will be described with reference to FIG. 1 to FIG. 3B.

An electronic device 100 is driven in response to an electrical signal. The electronic device 100 may include various embodiments. For example, the electronic device 100 may include at least any one among a display device for displaying an image, and an input sensing device for sensing inputs, such as touch, pressure, light and heat, applied from the outside. In the present embodiment, the electronic device 100 is exemplarily described as a display device.

The electronic device 100 may include a display panel 110, a flexible circuit board 120, and a main circuit board 130. The display panel 110, the flexible circuit board 120, and the main circuit board 130 are electrically connected.

The display panel 110 may include a display area DA, a peripheral area BA, and a pad area PA in a plan view.

The display area DA may be an area in which an image is displayed. In the display area DA, a plurality of pixels PX for realizing an image may be disposed. Pixels PX may be arranged in a matrix form along a first direction A1 and a second direction A2. The display panel 110 controls pixels PX to display various images.

Each of the pixels PX may include a display element and a driving element. The display element may include elements according to various examples. For example, the display element may be at least any one among a liquid crystal element, an organic light emitting element, an electrophoretic element, and an electrowetting element. However, the above-described elements are merely exemplarily described, and the display element may include elements according to various examples as long as an image may be realized according to an electrical signal. Thus, the display element is not limited to an element according to any one example.

The driving element controls driving of each of the display elements in each of the pixels PX. The driving element may include a thin film transistor. The display panel 110 according to an embodiment of the inventive concept may be driven through an active method by which the pixels PX may be each independently controlled.

The peripheral area BA is adjacent to the display area DA. In the peripheral area BA, signal lines connected to the pixels PX may be disposed. In the present embodiment, the peripheral area BA may have a frame shape surrounding the display area DA. However, the shape of the peripheral area BA is merely exemplarily illustrated, and the peripheral area BA may thus have various shapes as long as being adjacent to the display area DA. Therefore, the shape of the peripheral area BA is not limited to a shape according to any one example.

The pad area PA may be adjacent to the peripheral area BA. The pad area PA may be an area coupled with the flexible circuit board 120. Although not illustrated, a plurality of pads (not illustrated) for being electrically connected to the flexible circuit board 120 may be disposed in the pad area PA. The display panel 110 is electrically coupled to external electronic components such as the flexible circuit board 120 and the main circuit board 130 through the pad area PA.

The display panel 110 may include, in a cross sectional view, a base substrate 112, a display element layer 114, and an encapsulation layer 116 laminated along a third direction (A3).

The base substrate 112 may be a base layer on which the display element layer 114 is formed. The base substrate 112 may be a single layer or may include a plurality of insulation layers. The base substrate 112 may be at least any one among a glass substrate, a plastic substrate, a film, and a laminate including a plurality of organic films and/or inorganic films. The base substrate 112 is not limited to one according to any one example.

Although not illustrated, a driving element of the pixel PX, a signal line and the like are disposed on the base substrate 112. Accordingly, a laminated structure in which a plurality of conductive layers and a plurality of organic films and/or inorganic films are laminated are disposed on the base substrate 112.

The display element layer 114 is disposed on the base substrate 112. The display element layer 114 is electrically connected with the driving element and the signal line on the base substrate 112. The display element layer 114 includes display elements among the pixels PX described above. For example, when the display panel 110 is an organic light emitting display panel, the display element layer 114 may include an organic light emitting layer. The display area DA may correspond to an area in which the display element layer 114 is disposed.

The encapsulation layer 116 is disposed on the display element layer 114 to cover the display element layer 114. The encapsulation layer 116 protects the display element layer 114. Although not illustrated, the encapsulation layer 116 may cover even the side of the display element layer 114. In addition, the encapsulation layer 116 may not be included or may be replaced with another display substrate, according to the type of the display panel 110.

The flexible circuit board 120 is disposed on the pad area PA of the display panel 110 to connect the main circuit board 130 and the display panel 110. The flexible circuit board 120 is disposed on one side of the display panel 110 extending along the second direction A2.

The flexible circuit board 120 may be provided in plurality and arranged along the second direction A2. However, such arrangement is merely exemplarily illustrated, and the flexible circuit board 120 may be provided as a single component. Thus, the flexible circuit board 120 is not limited to one according to any one example.

The flexible circuit board 120 includes a flexible wiring substrate 122 and a driving circuit 125 disposed on the flexible wiring substrate 122. The flexible wiring substrate 122 and the driving circuit 125 will be described in more detail with reference to FIG. 3A and FIG. 3B.

The flexible wiring substrate 122 includes a flexible substrate 123, and a plurality of pads, and a plurality of wirings SL-120 may be disposed on the flexible wiring substrate 122.

The flexible substrate 123 may have a rectangular shape in a plan view. For example, the flexible substrate 123 includes a first side S1 and a second side S2 each of which extends along the second direction A2 and which are opposites to each other in the first direction A1, and a third side S3 and a fourth side S4 each of which extends along the first direction A1 and which are opposites to each other in the second direction A2. However, this shape is merely exemplarily illustrated, and the flexible substrate 123 may have various shapes, and thus have a plurality of sides.

The pads and the wirings SL-120 are disposed on the flexible substrate 123. The flexible substrate 123 may include poly imide (PI).

The pads include connection pads CPD, input pads IPD-120, output pads OPD-120, alignment pads APD-120, and at least one stress relaxation pad SPD. In FIG. 3B, the connection pads CPD are disposed between the driving circuit 125 and the flexible substrate 123.

The connection pads CPD are connected to connection terminals (not illustrated) of the driving circuit 125. In this embodiment, the connection pads CPD are disposed along both sides of the driving circuit 125, but such alignment is merely exemplarily illustrated. Thus, the connection pads CPD may be randomly arranged corresponding to the connection terminals of the driving circuit 125.

The input pads IPD-120 are connected to the main circuit board 130. The input pads IPD-120 are disposed in an input pad area IPP-120 which is disposed at one side of the flexible wiring substrate 122. The input pad area IPP-120 may be disposed at the second side S2. In a plan view, the input pad area IPP-120 overlaps the main circuit board 130.

The output pads OPD-120 are connected to the display panel 110. The output pads OPD-120 may be disposed in an output pad area OPP-120 which is disposed at the other side of the flexible wiring substrate 122. The output pad area OPP-120 may be disposed at the first side S1. The output pad area OPP-120 overlaps the display panel 110 in a plan view.

The input pads IPD-120 and the output pads OPD-120 may extend obliquely with respect to the first direction A1 and the second direction A2, respectively. The input pads IPD-120 and the output pads OPD-120 may be arranged such that the input and output pads IPD-120 and OPD-120 on both sides are symmetric to each other with respect to the center, respectively. The input pads IPD-120 and the output pads OPD-120 according to an embodiment of the inventive concept may respectively extend in a direction in which the input pads IPD-120 and the output pads OPD-120 converges toward at least one convergence point. A detailed description thereof will be described later.

In this embodiment, it is illustrated that one pad row is disposed in each of the input pad area IPP-120 and the output pad area OPP-120. The pad row includes a plurality of pads arranged along the second direction A2. However, the embodiment is merely exemplarily illustrated, so that in an embodiment of the inventive concept, a plurality of pad rows may also be disposed in each of the input pad area IPP-120 and the output pad area OPP-120, and the embodiment of the inventive concept is not limited to any one embodiment.

The alignment pads APD-120 are disposed in the output pad area OPP-120. The alignment pads APD-120 are disposed adjacent to the output pads OPD-120. In this embodiment, the alignment pads APD-120 may be arranged parallel to the output pads OPD-120. Accordingly, the alignment pads APD-120 may extend in an oblique direction with respect to the first direction A1 and the second direction A2. However, the embodiment is merely exemplarily illustrated, so that the alignment pads APD-120 according to an embodiment of the inventive concept may be arranged in various forms, and the embodiment of the inventive concept is not limited to any one embodiment.

The alignment pads APD-120 may be a reference point for controlling the connection position of the flexible circuit board 120 to the display panel 110 such that the flexible circuit board 120 is easily attached to the display panel 110 without misalignment. In this embodiment, the flexible circuit board 120 may control a bonding position in the first direction A1 through the alignment pads APD-120.

The alignment mark AM-120 may be adjacent to a pad disposed in the outermost side among the output pads OPD-120. The alignment mark AM-120 may extend in a direction crossing the output pads OPD-120. In addition, the alignment mark AM-120 may be parallel to the direction in which the first side S1 of the flexible substrate 123 extends.

The alignment mark AM-120 may be a reference point for controlling the connection position of the flexible circuit board 120 to the display panel 110 such that the flexible circuit board 120 is easily attached to the display panel 110 without misalignment. In this embodiment, the flexible circuit board 120 may control the boding position in the second direction A2 through the alignment mark AM-120. A detailed description thereof will be described later.

The stress relaxation pads SPD may be disposed between the alignment pads APD-120 and the output pads OPD-120. The stress relaxation pads SPD may be disposed on an empty space between the alignment pads APD-120 and the output pads OPD-120.

The stress relaxation pads SPD are spaced apart from the alignment pads APD-120 and the output pads OPD-120. The stress relaxation pads SPD are electrically insulated from the output pads OPD-120.

The stress relaxation pads SPD fills the empty space disposed between the alignment pads APD-120 and the output pads OPD-120. Accordingly, the stress relaxation pads SPD prevent an adhesive interconnect layer 140, which will be described later, from being filled in the empty space disposed between the alignment pads APD-120 and the output pads OPD-120. A detailed description thereof will be described later.

The alignment pads APD-120 and the output pads OPD-120 may be spaced from each other along the second direction A2 with the stress relaxation pads SPD interposed therebetween. In this embodiment, the number of the stress relaxation pads SPD provided herein may be two and the stress relaxation pads SPD are spaced from each other along the second direction A2 with the output pads OPD-120 interposed therebetween. However, the embodiment is merely exemplarily illustrated, and the number of the stress relaxation pads SPD according to an embodiment of the inventive concept may be various numbers, and the stress relaxation pads SPD may be arranged asymmetrically to each other with respect to the output pads OPD-120.

The stress relaxation pads SPD may have various shapes. In this embodiment, the stress relaxation pads SPD are illustrated to have a parallelogram shape corresponding to the obliquely extending output pads OPD-120 and the obliquely extending alignment pads APD-120. However, the embodiment is merely exemplarily illustrated, so that the stress relaxation pads SPD according to an embodiment of the inventive concept may have various shapes as long as being disposed in a space between the alignment pads APD-120 and the output pads OPD-120, and the embodiment of the inventive concept is not limited to any one embodiment.

Some of the wirings SL-120 are disposed at one side of the driving circuit 125, and the other parts of the wirings SL-120 are disposed at the other side of the driving circuit 125. Some of the wirings SL-120 connect the connection pads CPD and the input pads IPD-120.

The other part of the wirings SL-120 connect the connection pads CPD and the output pads OPD-120. Although not illustrated, the wirings SL-120 may also directly connect some of the input pads IPD-120 and some of the output pads OPD-120.

The flexible wiring substrate 122 may further include a solder resist layer which is disposed on an insulation layer and covers at least the wirings SL-120. The solder resist layer may further cover the periphery of the pads CPD, IPD-120, and OPD-120, but exposes each of the pads CPD, IPD-120, and OPD-120 at the least.

Openings corresponding to the pads CPD, IPD-120, and OPD-120 may be formed in the solder resist layer. The pads CPD, IPD-120, and OPD-120 may be exposed from the solder resist layer and connected to the driving circuit 125, the main circuit board 130, and the display panel 110, respectively.

In this embodiment, the surface on which the pads CPD, IPD-120, OPD-120, and SPD are exposed may be defined as a coupling surface CS of the flexible wiring substrate 122, and the surface opposed to the coupling surface CS may be defined as a non-coupling surface NCS. In this embodiment, it is illustrated that the driving circuit 125 is mounted on the coupling surface CS. However, the embodiment is merely exemplarily illustrated, so that in an embodiment of the inventive concept, the driving circuit 125 may be disposed on the non-coupling surface NCS different from the surface on which the pads CPD, IPD-120, OPD-120, and SPD are exposed, and the embodiment of the inventive concept is not limited to any one embodiment.

The driving circuit 125 may include at least one driving chip. In this embodiment, the flexible circuit board 120 is illustrated to have a chip-on-film structure, and the embodiment of the inventive concept is not limited thereto.

The driving circuit 125 is electrically connected to the wirings SL-120 on the flexible substrate 123. The driving circuit 125 may provide electrical signals which drive the display panel 110 to the display panel 110. In addition, the driving circuit 125 may process electrical signals output from the display panel 110 and provide the processed electrical signals to the main circuit board 130.

The driving circuit 125 may be a various driving circuit. For example, the driving circuit 125 may include a data driving circuit 125. In this case, a pad part (not illustrated) of the display panel 110 includes data pads electrically connected to data lines, and control signal pads electrically connected to control signal lines. The data lines may be connected to the pixels PX, and the control signal lines may be connected to a gate driving circuit.

However, such a configuration is merely exemplarily illustrated, so that when the display panel 110 is a touch panel for sensing touch applied from the outside, the driving circuit 125 may also provide a driving signal for sensing touch. The electronic device 100 according to an embodiment of the inventive concept may include various driving circuits 125, and the embodiment of the inventive concept is not limited to any one embodiment.

Referring again to FIG. 1 and FIG. 2, the main circuit board 130 is connected to the flexible circuit board 120. The main circuit board 130 provides image data, a control signal, a power supply voltage, and the like to the display panel 110 or the driving circuit 125. The main circuit board 130 is a wiring substrate distinguished from the flexible circuit board 120, and may include an active element and a passive element. The main circuit board 130 may be flexible or rigid, and the embodiment of the inventive concept is not limited to any one embodiment.

The electronic device 100 may further include an adhesive interconnect layer 140, which is disposed between the main circuit board 130 and the flexible circuit board 120 to electrically connect the main circuit board 130 and the flexible circuit board 120, and which is disposed between the display panel 110 and the flexible circuit board 120 to electrically connect the display panel 110 and the flexible circuit board 120.

The adhesive interconnect layer 140 has electrical conductivity and may have adhesiveness. The adhesive interconnect layer 140 may include a thermosetting or photo-curable material. For example, the adhesive interconnect layer 140 may include an anisotropic conductive film (ACF).

The electronic device 100 according to an embodiment of the inventive concept includes electronic components, the display panel 110, the flexible circuit board 120, and the main circuit board 130 including pads for electrical connection, and includes the adhesive interconnect layer 140 for coupling the electronic components, the display panel 110, the flexible circuit board 120, and the main circuit board 130. Accordingly, the electronic device 100 may facilitate electrical connection even for a plurality of electronic components independently provided separately. A detailed description thereof will be described later.

Figure 4:
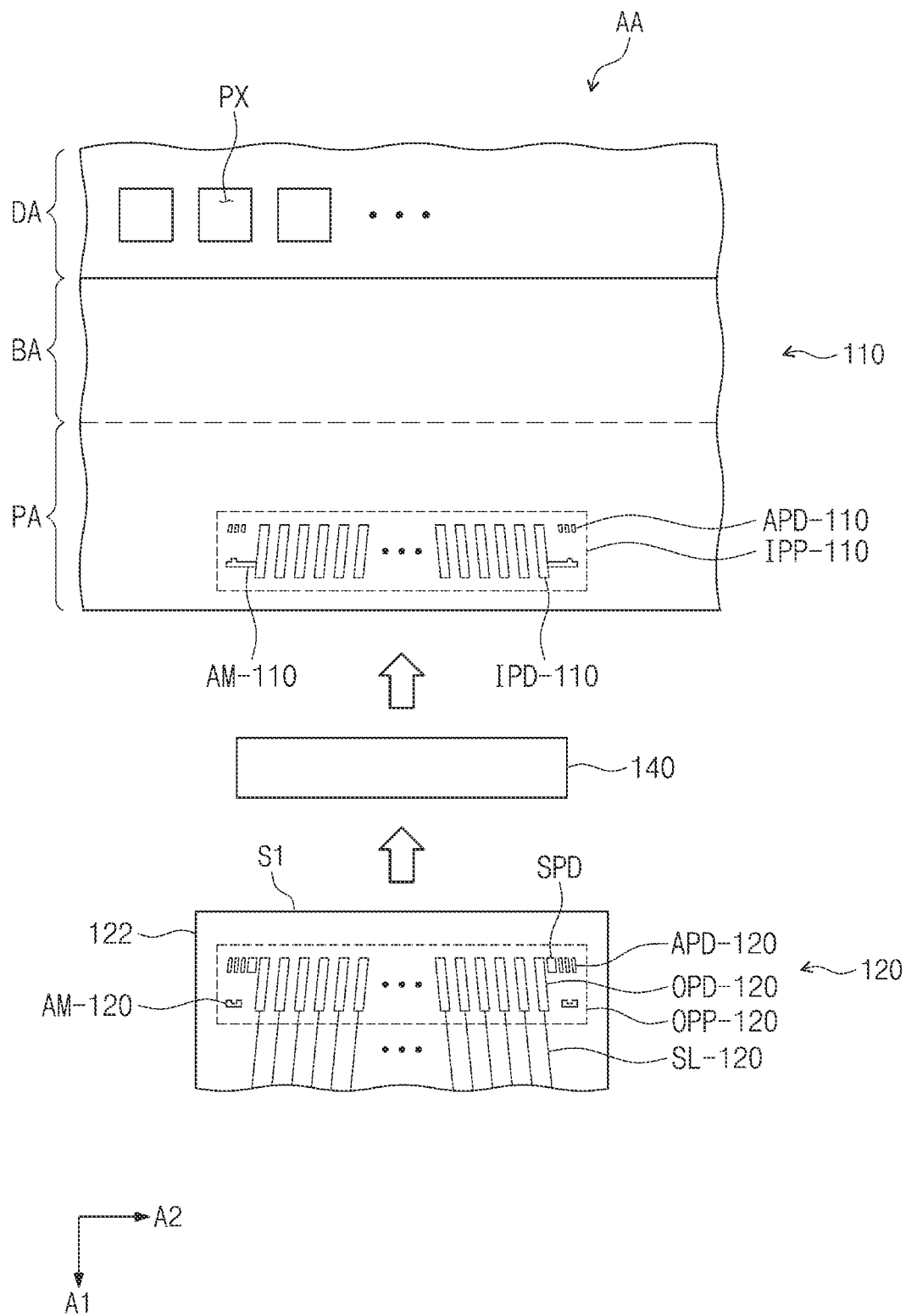
FIG. 4 is a plan view in which a part of the electronic device illustrated in FIG. 1 is separated.
Figure 5A:
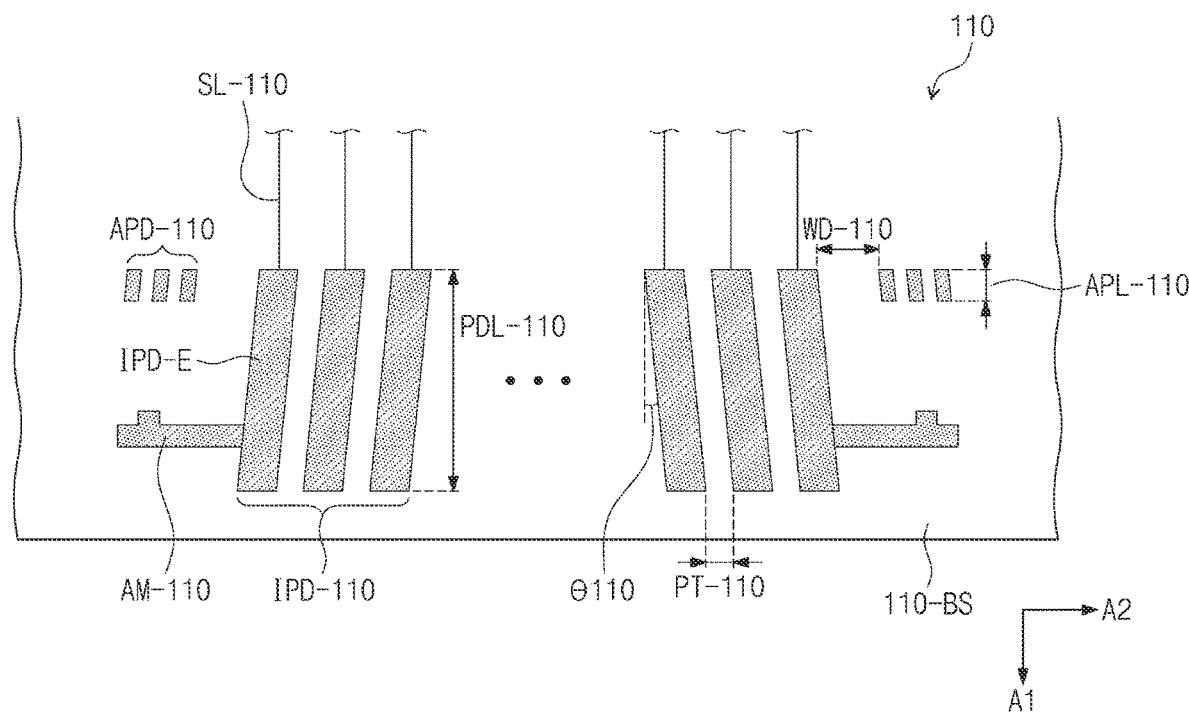
FIG. 5A and FIG. 5B are plan views in which some of elements illustrated in FIG. 4 are enlarged.
Figure 5B:
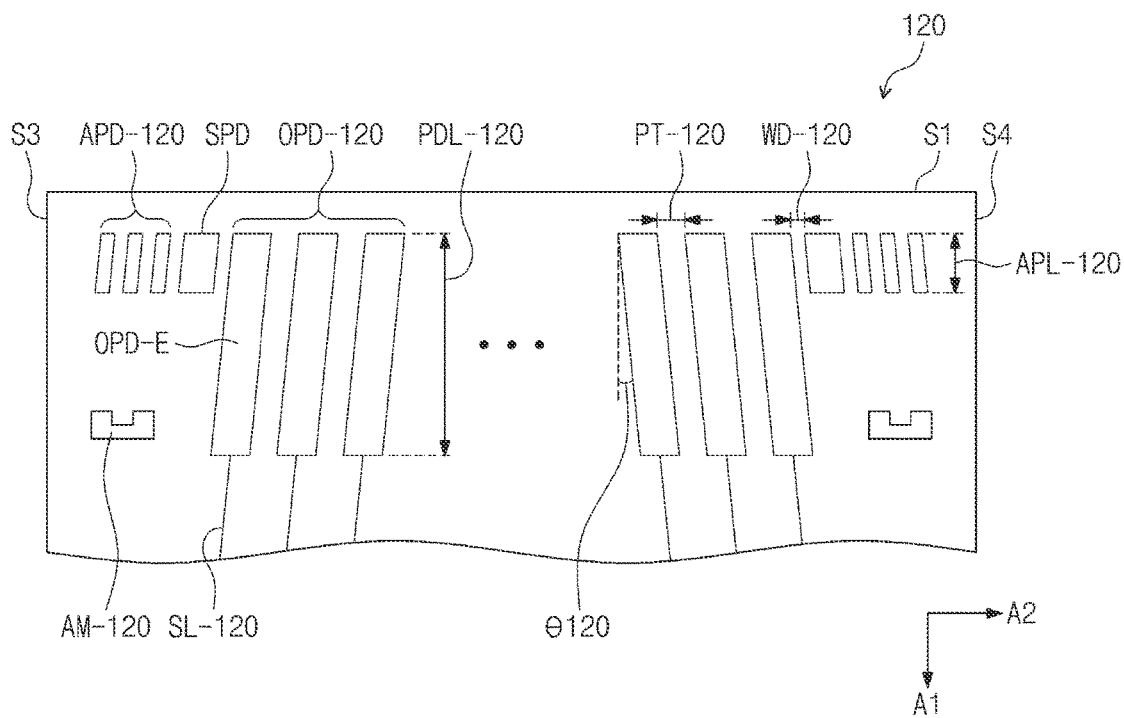
Figure 5C:
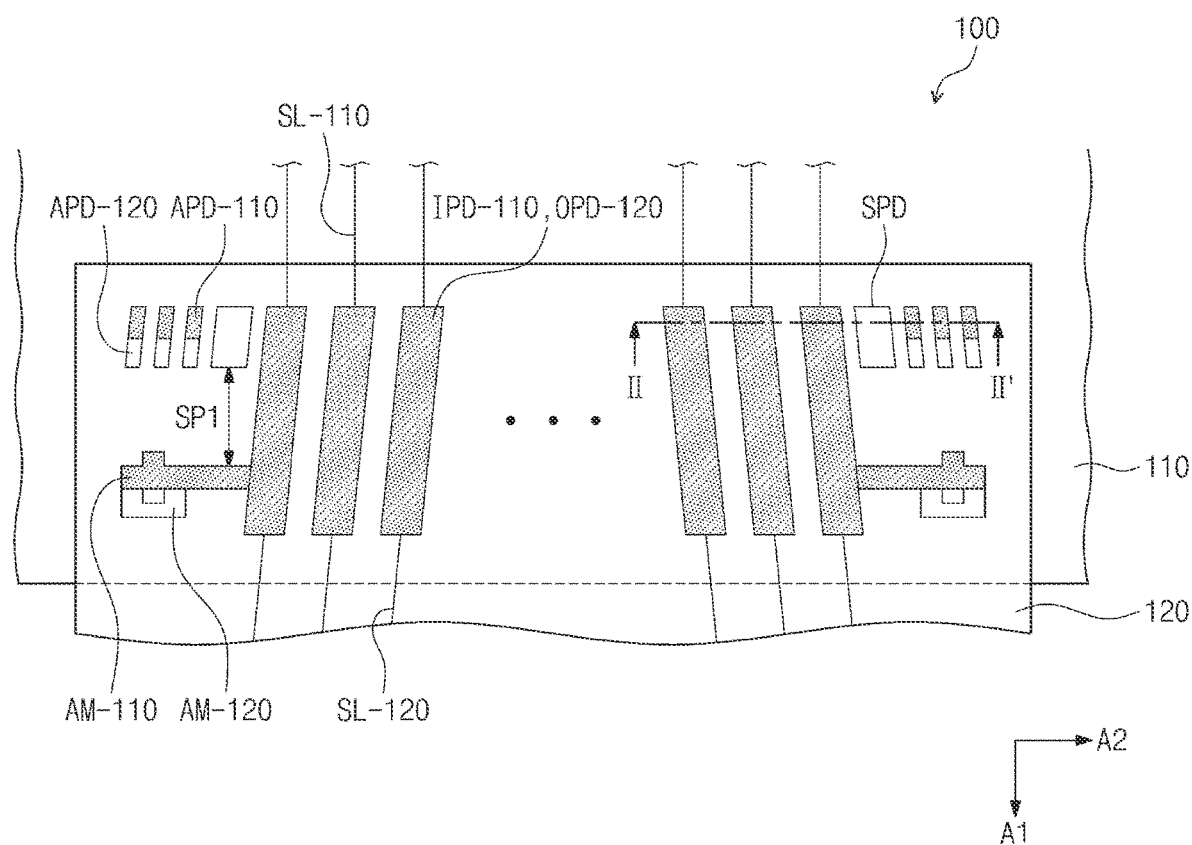
FIG. 5C is a plan view in which the elements illustrated in FIG. 4 are coupled.

FIG. 4 is a plan view in which the part of the electronic device illustrated in FIG. 1 is separated. FIG. 5A and FIG. 5B are plan views in which some of the elements illustrated in FIG. 4 are enlarged, and FIG. 5C is a plan view in which the elements illustrated in FIG. 4 are coupled. Hereinafter, an electronic device according to an embodiment of the inventive concept will be described with reference to FIG. 4 to FIG. 5C. The same elements as those described in FIG. 1 to FIG. 3C are denoted by the same reference numerals, and redundant description will not be provided herein.

As illustrated in FIG. 4 and FIG. 5A, the display panel 110 may include a plurality of input pads IPD-110 (hereinafter panel pads), a plurality of alignment pads APD-110, and an alignment mark AM-110. The panel pads IPD-110, the alignment pads APD-110, and the alignment mark AM-110 are disposed in the pad area PA.

The panel pads IPD-110 are connected to a plurality of signal lines SL-110. The panel pads IPD-110 may correspond to output pads OPD-120 of the flexible circuit board 120. The display panel 110 may be electrically connected to the flexible circuit board 120 to receive data signals, control signals, and the like.

Specifically, the panel pads IPD-110 are arranged along the second direction A2, and each may extend obliquely with respect to the first direction A1 and the second direction A2. Accordingly, the panel pads IPD-110 may form a first angle θ110 with respect to the first direction A1. The first angle θ110 is an acute angle, and may be greater than 0 degrees and smaller than 90 degrees.

The panel pads IPD-110 may extend in oblique directions such that the left-side pads and the right-side pads are symmetrical to each other. The left-side pads of the panel pads IPD-110 may extend in an oblique direction such that the left-side pads are inclined to the right with respect to the first direction A1, while the right-side pads of the panel pads IPD-110 may extend in an oblique direction such that the right-side pads are inclined to the left with respect to the first direction A1.

The panel pads IPD-110 may each have a parallelogram shape having a first length PDL-110. The panel pads IPD-110 may be arranged to be spaced apart from each other by a first interval PT-110 along the second direction A2. The first interval PT-110 may be constant or different for each pad. For example, the first interval PT-110 may become greater as the panel pads IPD-110 are farther away from the center toward the left/right side.

The alignment pads APD-110 (hereinafter panel alignment pads) may correspond to the alignment pads APD-120 of the flexible circuit board 120 in the alignment process for the flexible circuit board 120. Together with the alignment pads APD-120, the panel alignment pads APD-110 may be used to control the position for connecting the flexible circuit board 120.

The panel alignment pads APD-110 are spaced apart from the panel pads IPD-110 along the second direction A2. A spaced space having a first distance WD-110 which is measured in the second direction A2 may be provided between the panel alignment pads APD-110 and panel pads IPD-110. The first distance WD-110 may be defined as a distance between a pad closest to the panel pads IPD-110 among the panel alignment pads APD-110 and a pad closest to the panel alignment pads APD-110 among the panel pads IPD-110.

The panel alignment pads APD-110 may have a shorter length than the panel pads IPD-110. Accordingly, the panel alignment pads APD-110 may have parallelogram shapes having a second length APL-110 which is shorter than the first length PDL-110.

Meanwhile, in this embodiment, the panel alignment pads APD-110 are illustrated as a plurality of pads, but the embodiment is merely exemplarily illustrated. Alternatively, the panel alignment pads APD-110 according to an embodiment of the inventive concept may be a single pad, and the embodiment of the inventive concept is not limited to any one embodiment.

The alignment mark AM-110 (hereinafter a panel alignment mark) may be spaced along the first direction A1 from the panel alignment pads APD-110. The panel alignment mark AM-110 may correspond to the alignment mark AM-120 of the flexible circuit board 120 in the alignment process for the flexible circuit board 120.

The panel alignment mark AM-110 is disposed adjacent to the panel pads IPD-110. The panel alignment mark AM-110 may be disposed so as to contact a pad IPD-E disposed in the outermost side among the panel pads IPD-110. However, the embodiment is merely exemplarily illustrated, so that the panel alignment mark AM-110 may be provided in various forms as long as the panel alignment mark AM-110 is able to correspond to the alignment mark AM-120 of the flexible circuit board 120, and the embodiment of the inventive concept is not limited to any one embodiment.

Referring to FIG. 4 and FIG. 5B, the flexible circuit board 120 includes a plurality of output pads OPD-120, a plurality of alignment pads APD-120, alignment marks AM-120, and a stress relaxation pad SPD. Meanwhile, the plurality of output pads OPD-120, the plurality of alignment pads APD-120, the alignment marks AM-120, and the stress relaxation pad SPD, illustrated in FIG. 5B are disposed substantially on the rear surface, but are illustrated as being on the top surface by projecting onto the top surface for easy explanation.

The output pads OPD-120 are arranged along the second direction A2, and each extends obliquely with respect to the first direction A1 and the second direction A2. The output pads OPD-120 may extend in a direction forming a second angle θ120 with respect to the first direction A1.

The second angle θ120 may be the same or different for each of the output pads OPD-120. For example, the second angle θ120 may become greater as the output pads OPD-120 get closer to the left side or the right side from the center.

The output pads OPD-120 may be spaced by second intervals PT-120 with respect to the second direction A2. The second intervals PT-120 may be the same or different. In this embodiment, the second intervals PT-120 are illustrated to be equal to each other. However, the embodiment is merely exemplarily illustrated, and the second interval PT-120 may become greater or smaller as the output pads OPD-120 get closer to the left side or the right side from the center.

The output pads OPD-120 may have parallelogram shapes having a third length PDL-120 in the first direction A1. The third length PDL-120 may be the same as or different from the first length PDL-110.

The alignment pads APD-120 are spaced from the output pads OPD-120 in the second direction A2. The alignment pads APD-120 may have a shape similar to those of the output pads OPD-120. For example, the alignment pads APD-120 may extend in a direction parallel to the output pads OPD-120.

The alignment pads APD-120 have a fourth length APL-120 in the first direction A1. The fourth length APL-120 may be smaller than the third length PDL-120. In addition, the fourth length APL-120 may be larger than the second length APL-110.

In this embodiment, the flexible circuit board 120 may aligned in a manner of considering the overlapping area of the alignment pads APD-120 and the panel alignment pads APD-110. However, the embodiment is merely exemplarily illustrated, so that the alignment pads APD-120 may also have a length equal to or less than the second length APL-110, and the embodiment of the inventive concept is not limited to any one embodiment.

The alignment mark AM-120 is spaced apart from the alignment pads APD-120 in the first direction A1. The alignment mark AM-120 may be aligned to the panel alignment mark AM-110 in the alignment process for the flexible circuit board 120.

The stress relaxation pads SPD may be disposed in a space between the alignment pads APD-120 and the output pads OPD-120. Accordingly, a second distance WD-120 between a pad OPD-E disposed at the outermost side among the output pads OPD-120 and a pad (herein, stress relaxation pad SPD) adjacent thereto is shorter than the first distance WD-110 in the display panel 110.

The stress relaxation pads SPD may be pads independent from the output pads OPD-120, the alignment pads APD-120, and the alignment mark AM-120. In a plan view, the stress relaxation pad SPD doesn't overlap the output pads OPD-120, the alignment pads APD-120, and the alignment mark AM-120. The stress relaxation pads SPD may be electrically insulated from the output pads OPD-120.

Referring to FIG. 4 and FIG. 5C, the flexible circuit board 120 is coupled to the display panel 110 with the adhesive interconnect layer 140 interposed therebetween. In this case, the output pads OPD-120 of the flexible circuit board 120 and the panel pads IPD-110 of the display panel 110 respectively overlap and are electrically connected to each other such that the flexible circuit board 120 and the display panel 110 may be electrically connected.

In this case, the alignment pads APD-120 and the panel alignment pads APD-110 may be used to determine whether the flexible circuit board 120 is aligned in the first direction A1. For example, the position in the first direction A1 of the flexible circuit board 120 may be aligned such that the ends of the shaded panel alignment pads APD-110 are positioned in the middle of the alignment pads APD-120.

Meanwhile, the alignment mark AM-120 and the panel alignment mark AM-110 may be used to determine whether the flexible circuit board 120 is aligned in the second direction A2. For example, the position in the second direction A2 of the flexible circuit board 120 may be aligned such that the protruding portion of the shaded panel alignment mark AM-110 and the concave portion of the alignment mark AM-120 are positioned to be aligned along the first direction A1. However, the embodiment is merely exemplarily illustrated, so that the electronic device according to an embodiment of the inventive concept may be aligned according to various alignment methods and may include various alignment marks and alignment pads, and the embodiment of the inventive concept is not limited to any one embodiment.

The panel pads IPD-110 and the output pads OPD-120 overlap each other and may thus be stably connected. In this embodiment, the panel pads IPD-110 and the plurality of output pads OPD-120 are illustrated to have a one to one correspondence, but are not limited thereto. In the electronic device according to an embodiment of the inventive concept, the panel pads IPD-110 and the plurality of output pads OPD-120 may include different number of pads or different number of pad rows, and the embodiment of the inventive concept is not limited to any one embodiment.

In this case, the stress relaxation pad SPD doesn't overlap any pad in the display panel 110. As the flexible circuit board 120 and the display panel 110 are connected, the stress relaxation pad SPD may be disposed in a space between the panel pads IPD-110 and the panel alignment pads APD-110. The stress relaxation pad SPD may have a width smaller than the first distance WD-110. Accordingly, the stress relaxation pad SPD doesn't overlap the panel pads IPD-110 and panel alignment pads APD-110 in a plan view.

The stress relaxation pad SPD according to an embodiment of the inventive concept may be an independent pad which is distinguished from the alignment pad and alignment mark for aligning the position between the flexible circuit board 120 and the display panel 110. In addition, the stress relaxation pad SPD may be an independent pad which is electrically insulated and thus distinguished from the panel pads IPD-110 and the plurality of output pads OPD-120.

The electronic device according to an embodiment of the inventive concept further includes a stress relaxation pad distinguished from a pad for electrical connection or a pad for alignment, thereby enabling to improve the reliability of the electronic device and to reduce defects and the like after the connection process of the flexible circuit board 120. A detailed description thereof will be described later.

Figure 6A:
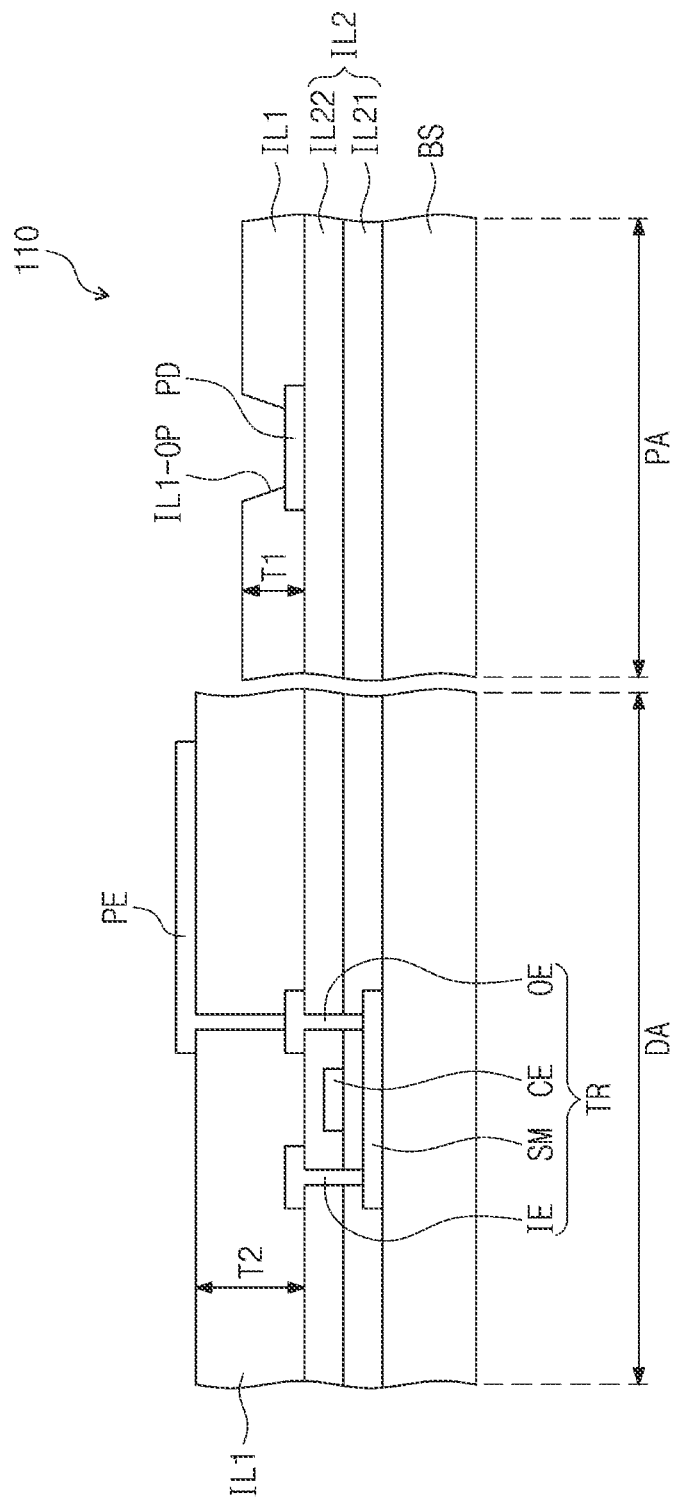
FIG. 6A is a cross-sectional view in which a part of the electronic device according to an embodiment of the inventive concept is separated.
Figure 6B:
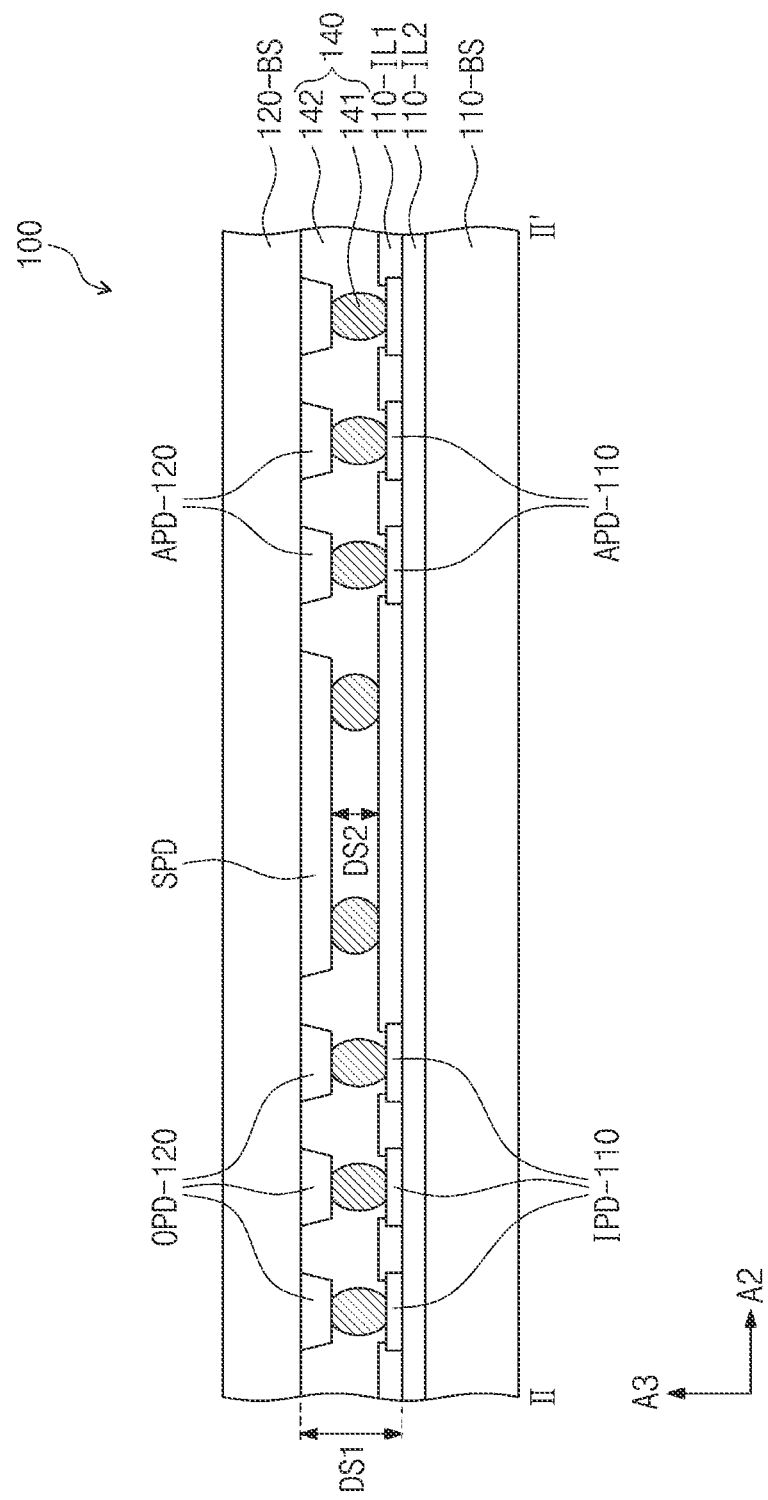
FIG. 6B is a cross-sectional view taken along line II-II' illustrated FIG. 5C.
Figure 6C:
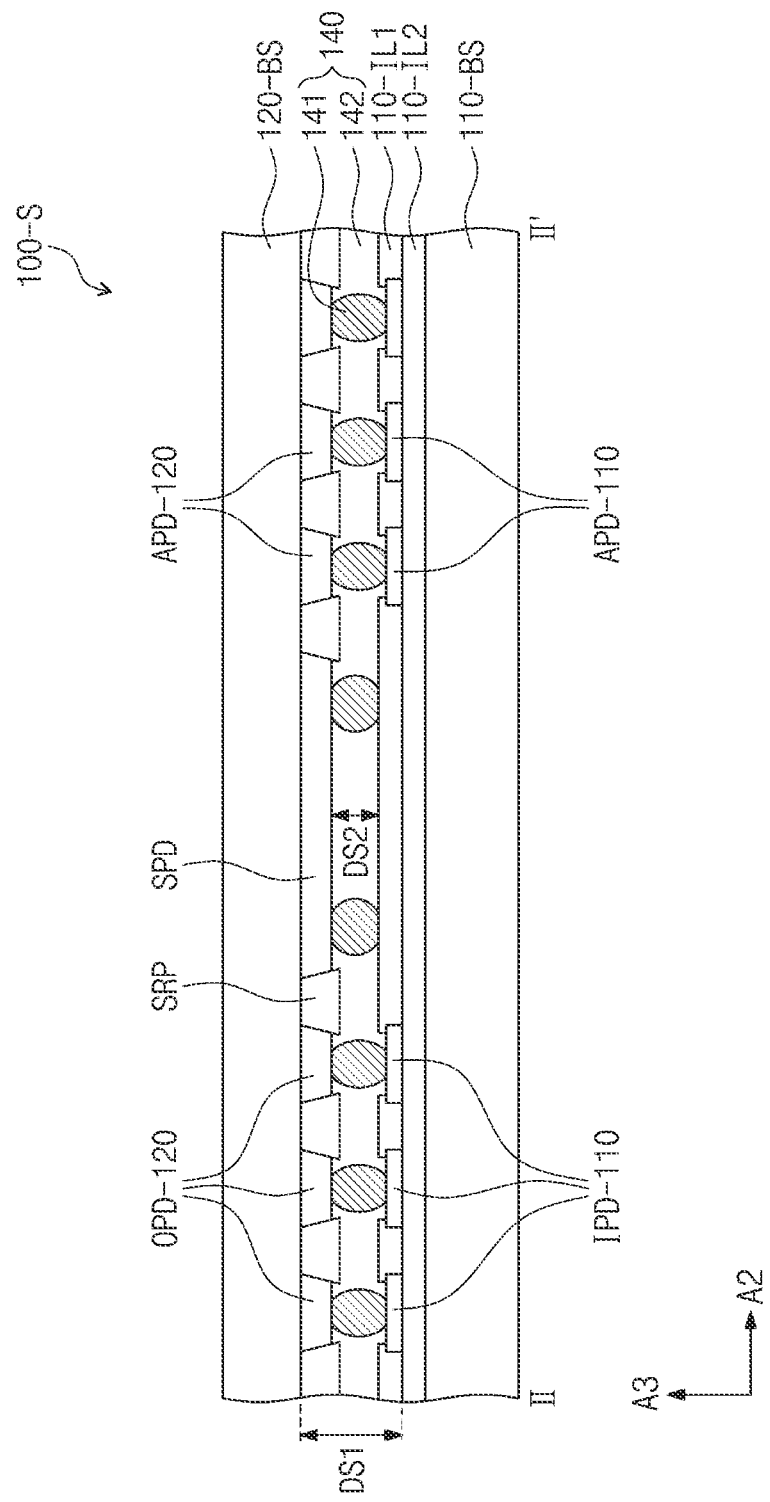
FIG. 6C is a cross-sectional view illustrating a part of the electronic device according to an embodiment of the inventive concept.
Figure 7A:
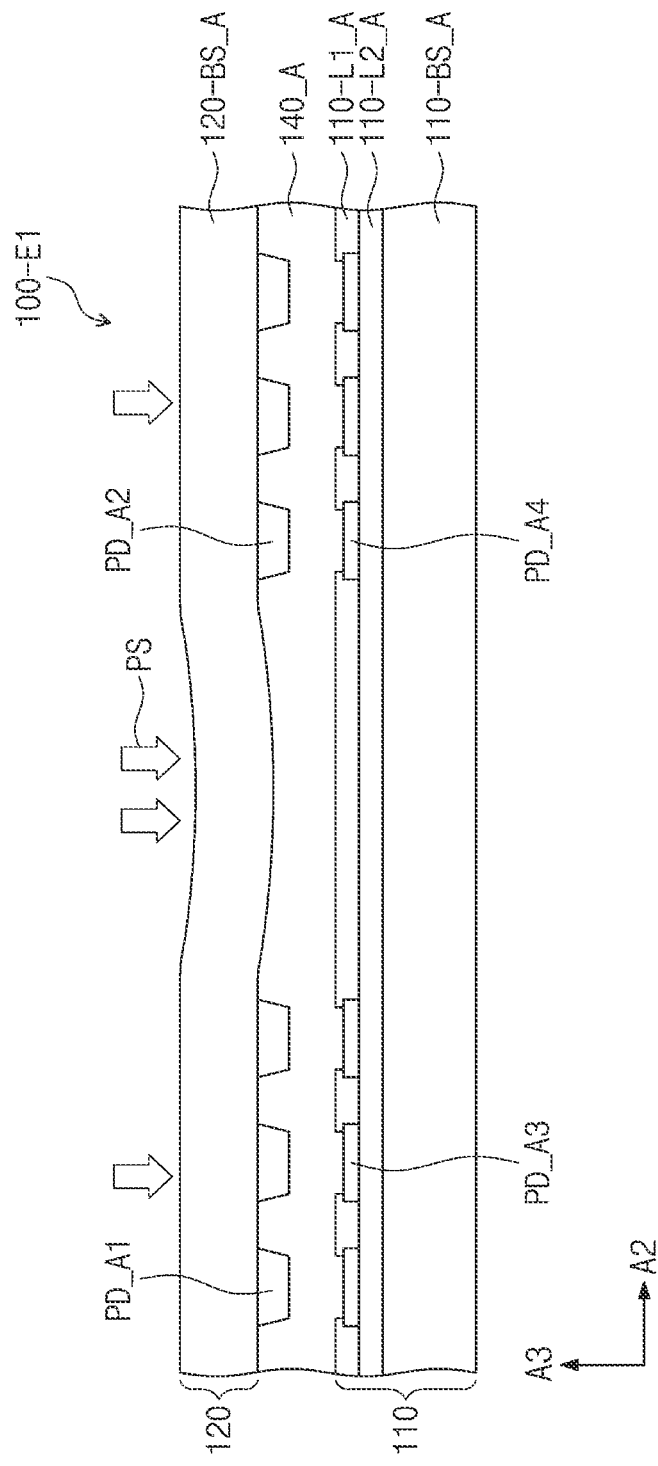

FIG. 6A is a cross-sectional view in which a part of the electronic device according to an embodiment of the inventive concept is separated. FIG. 6B is a cross-sectional view taken along line II-II' illustrated in FIG. 5C. FIG. 6C is a cross-sectional view illustrating a part of the electronic device according to an embodiment of the inventive concept. FIG. 7A and FIG. 7B are cross-sectional views of a part of an electronic device according to a comparative example. FIG. 6C illustrates the area corresponding to the area of FIG. 6B for easy explanation. FIG. 7A and FIG. 7B are respectively cross-sectional views taken at different times in order to describe the change over time.

Hereinafter, the electronic device according to an embodiment of the inventive concept will be described with reference to FIG. 6A to FIG. 7B. The same elements as those described in FIG. 1 to FIG. 5C are denoted by the same reference numerals, and redundant description will not be provided herein.

FIG. 6A illustrates the display area DA and the pad area PA of the display panel 110, respectively. As illustrated in FIG. 6A, the display panel 110 may include a base substrate BS, a first insulation layer Ill, a second insulation layer IL2, a thin film transistor TR, a pixel electrode PE, and a pad PD. The second insulation layer IL2 may include a first layer IL21 and a second layer IL22.

The base substrate BS has an insulation property. The base substrate BS may include a silicon substrate, a glass substrate, a plastic substrate, or a flexible film.

The thin film transistor TR and the pixel electrode PE constitute a pixel PX (see FIG. 1). The thin film transistor TR may correspond to the driving element described above. The first insulation layer IL1 is disposed between the thin film transistor TR and the pixel electrode PE. The pixel electrode PE may be electrically connected to the thin film transistor TR through a contact hole formed in the first insulation layer ILL The thin film transistor TR includes a semiconductor pattern SM, a control electrode CE, an input electrode IE, and an output electrode OE. In a plan view, the control electrode CE is superimposed on the semiconductor pattern SM. The control electrode CE may be spaced apart from the semiconductor pattern SM with the first layer IL21 of the second insulation layer IL2 interposed therebetween. In this embodiment, the first layer IL21 may be a gate insulation layer.

The input electrode IE and the output electrode OE may be disposed on the second layer IL22 of the second insulation layer IL2. The input electrode IE and the output electrode OE may be connected to the semiconductor pattern SM through contact holes form in the first layer IL21 and the second layer IL22. The second layer IL22 may be disposed between the control electrode CE and the input electrode IE, and between the control electrode CE and the output electrode OE. In this embodiment, the second layer IL22 may be a passivation layer.

The pixel electrode PE is disposed on the first insulation layer ILL The pixel electrode PE may be one electrode of the display panel described above. The pixel electrode PE may be one electrode of a liquid crystal capacitor, or may be an anode electrode or cathode electrode of the organic light emitting element.

The first insulation layer IL1 is disposed between the pixel electrode PE and the thin film transistor TR. The first insulation layer IL1 may cover the thin film transistor TR to provide a flat surface to the pixel electrode PE.

The first insulation layer IL1 may include a material different from the second insulation layer IL2. Particularly, the first insulation layer IL1 may include a material different from that of the second layer IL22, which is in contact with the first insulation layer IL1, among the second insulation layer IL2. In this embodiment, the first insulation layer IL1 may include an organic material, and the second layer IL22 may include an inorganic material.

Meanwhile, the pad PD may be provided on the second insulation layer IL2. The first insulation layer IL1 may extend from the display area DA to cover even the pad area PA. The first insulation layer IL1 includes an opening IL1-OP for exposing the pad PD in the pad area PA.

The first insulation layer IL1 is provided on the second insulation layer IL2 to expose at least a portion of the pad PD. The surface of the pad PD, which is exposed by the first insulation layer Ill, may be a connection surface to which the external terminal is connected. Meanwhile, the first insulation layer IL1 may have a relatively smaller thickness in the pad area PA than in the display area DA. Therefore, a thickness T1 in the pad area PA of the first insulation layer IL1 may be equal to or less than a thickness T2 in the display area DA. That is, the thickness T1 of the first insulation layer IL1 in the pad area PA may be the same as the thickness T2 in the display area DA or smaller than the thickness T2 in the display area DA. In the electronic device according to an embodiment of the inventive concept, the thickness of the first insulation layer IL1 in the pad area PA is relatively reduced to easily expose the connection surface of the pad PD, thereby achieving stable connection with the external terminal.

The display panel 110 may receive an electrical signal applied from the outside through the connection surface of the pad PD, or may provide the generated electrical signal to the outside. In this embodiment, the pad PD may be disposed on the same layer as the input electrode IE and the output electrode OE.

However, the embodiment is merely exemplarily illustrated, and the pad PD may include a plurality of conductive patterns laminated along the thickness direction. In this case, the conductive patterns are disposed between the first layer IL21 and the base substrate BS and between the first layer IL21 and the second layer IL22, and may be connected to each other through a contact hole formed in the second insulation layer IL2. Even in this case, the pad PD connected to the external terminal may be provided on the second insulation layer IL2.

As illustrated in FIG. 6B, the display panel 110 includes a base substrate 110-BS, a first insulation layer 110-IL1, a second insulation layer 110-IL2, and a plurality of pads in a cross sectional view. In this embodiment, the pads PD illustrated in FIG. 6A are exemplarily illustrated as the panel pads IPD-110 and the panel alignment pads APD-110.

The first insulation layer 110-IL1 and the second insulation layer 110-IL2 may be some components of a driving element layer. The first insulation layer 110-IL1 may correspond to the first insulation layer IL1 illustrated in FIG. 6A, and the second insulation layer 110-IL2 may correspond to the second insulation layer IL2.

The first insulation layer 110-IL1 is disposed on the base substrate 110-BS. Although not illustrated, at least one conductive layer may be further disposed between the first insulation layer 110-IL1 and the base substrate 110-BS. The first insulation layer 110-IL1 may include an organic material. In this embodiment, the thickness of the first insulation layer 110-IL1 may be about 8000 Å or less.

The second insulation layer 110-1L2 is disposed between the first insulation layer 110-IL1 and the base substrate 110-BS. Although not illustrated, at least one conductive layer may be further disposed between the second insulation layer 110-IL2 and the first insulation layer 110-IL1.

The first insulation layer 110-IL1 is disposed on the second insulation layer 110-IL2 to expose at least some of each of the panel pads IPD-110 and the panel alignment pads APD-110. The exposed pads contact the adhesive interconnect layer 140.

The second insulation layer 110-IL2 may include a material different from that of the first insulation layer 110-IL1. For example, the second insulation layer 110-IL2 may include an inorganic material. For example, the second insulation layer 110-IL2 may include silicon oxide, silicon nitride, or a combination thereof. Accordingly, the second insulation layer 110-IL2 has a lower adhesive force with respect to the first insulation layer 110-IL1 than in the case where the second insulation layer 110-IL2 includes the same material as the first insulation layer 110-IL1 or includes an organic material.

The panel pads IPD-110 and the panel alignment pads APD-110 are disposed on the second insulation layer 110-IL2. In this embodiment, the panel pads IPD-110 and the panel alignment pads APD-110 may contact the first insulation layer 110-IL1.

The panel pads IPD-110 and the panel alignment pads APD-110 are disposed on the same layer. The panel pads IPD-110 and the panel alignment pads APD-110 may include the same material, and may be patterned at the same time by using a single mask.

The adhesive interconnect layer 140 may include a plurality of conductive particles 141 and a resin layer 142. The conductive particles 141 are dispersed in the resin layer 142.

The conductive particles 141 may include a material having high electrical conductivity. In addition, the conductive particles 141 may include a material having high malleability or high workability. The conductive particles 141 are disposed between the panel pads IPD-110 and the output pads OPD-120 to electrically connect the panel pads IPD-110 and the output pads OPD-120.

The resin layer 142 allows the conductive particles 141 to be stably dispersed in a space defined by the first thickness DS1 between the flexible circuit board 120 and the display panel 110. The resin layer 142 has adhesiveness. The resin layer 142 may include a thermosetting or photo-curable material.

In this embodiment, the resin layer 142 may be in contact with the first insulation layer 110-IL1. Due to adhesiveness inherent in the resin layer 142, an adhesive force acts between the resin layer 142 and the first insulation layer 110-IL1. In this embodiment, the adhesive force between the resin layer 142 and the first insulation layer 110-IL1 may be greater than the adhesive force between the first insulation layer 110-IL1 and the second insulation layer 110-IL2.

The electronic device according to this embodiment further includes a stress relaxation pad SPD. The stress relaxation pad SPD is disposed on the same layer as the output pads OPD-120 and the alignment pads APD-120. Therefore, the stress relaxation pad SPD may be disposed on a second base substrate 120-BS which is a flexible wiring substrate 122 in FIG. 2.

In this embodiment, the stress relaxation pad SPD may include the same material as the output pads OPD-120 and the alignment pads APD-120. For example, the stress relaxation pad SPD may include a metal having high conductivity. The stress relaxation pad SPD, the output pads OPD-120, and the alignment pads APD-120 may be patterned at the same time by using a single mask. However, the embodiment is merely exemplarily illustrated, so that the stress relaxation pad SPD may include a material different from those of the output pads OPD-120 and the alignment pads APD-120, and may also be formed by other processes differing from the processes for the output pads OPD-120 and the alignment pads APD-120.

The stress relaxation pad SPD is disposed not to overlap any other pads. However, the stress relaxation pad SPD is disposed so as to superimpose the space between the panel pads IPD-110 and the panel alignment pads APD-110.

Accordingly, the first thickness DS1 of the adhesive interconnect layer 140 is reduced to a second thickness DS2 by the stress relaxation pads SPD present in the empty space between the panel pads IPD-110 and the panel alignment pads APD-110. The specific effects thereof will be described in more detail with reference to the following comparative example.

FIG. 7A illustrates a comparative example 100-E1 in a state in which a pressure is applied for coupling to the flexible circuit board 120, and FIG. 7B illustrates a comparative example 100-E2 after a predetermined time has passed. Here, the comparative examples 100-E1 and 100-E2 have the same structure with each other but has only a time difference therebetween. In addition, in the comparative examples 100-E1 and 100-E2, all configurations except for the stress relaxation pad SPD correspond to the electronic device according to an embodiment of the inventive concept are the same, so that redundant description will not be provided herein. In this embodiment, the coupling of the flexible circuit board and the display panel may be performed by a thermo-compression bonding process.

As illustrated in FIG. 7A, when a predetermined pressure is applied in order to couple a flexible circuit board 120 and a display panel 110, a predetermined compression stress PS may be applied to a second base substrate 120-BS_A. A plurality of pads PD_A1 and PD_A2 disposed on the lower surface of the second the base substrate 120-BS_A. And a plurality of pads PD_A3 and PD_A4 disposed on the upper surface of the first base substrate 110-BS_A. The pads PD_A1, PD_A2, PD_A3, and PD_A4 are respectively corresponding to pads OPD-120, APD-120, IPD-110, and APD-110. An adhesive interconnect layer 140_A has flexibility and fluidity, so that the compression stress PS caused by pressure partially reduces the thickness of the adhesive interconnect layer 140_A disposed between the plurality of pads PD_A1 and PD_A2.

Then, as illustrated in FIG. 7B, when the predetermined pressure applied to the flexible circuit board 120 and the display panel 110 is removed, a stress RS caused by a repulsive force may be applied to the second base substrate 120-BS_B. The stress RS caused by the repulsive force may correspond to tensile stress, and is applied in the upward direction opposite to the application direction of the compression stress PS, while having the same magnitude as that of the compression stress PS.

The stress RS caused by the repulsive force of the second base substrate 120-BS_B may correspond to resilience, and thus the second base substrate 120-BS-B may be returned to a flat shape.

In this case, the adhesive interconnect layer 140_B may be also moved upward due to the stress RS caused by the repulsive force. However, the adhesive interconnect layer 140_B has been cured, and thus has lower fluidity than the adhesive interconnect layer 140_A in FIG. 7A. Accordingly, the adhesive interconnect layer 140_B may not restore the reduced thickness but moves upward together with the second base substrate 120-BS_B by a movement force RS-d of the second base substrate 120-BS_B.

In this case, a first insulation layer 110-IL1_B, which is in contact with the adhesive interconnect layer 140_B, is lifted upward from a second insulation layer 110-IL2_B. Accordingly, a predetermined space SP is formed between the second insulation layer 110-IL2_B and the first insulation layer 110-IL1_B, and a gap GP is formed due to the lifting.

According to the comparative example, the adhesive force between the second insulation layer 110-IL2_B and the first insulation layer 110-IL1_B, which is made of a material different from that of the second insulation layer 110-IL2_B, fails to overcome the movement force RS-d applied to the first insulation layer 110-IL1_B, thereby causing delamination defects.

Alternatively, the electronic device according to an embodiment of the inventive concept further includes a stress relaxation pad SPD, thereby reducing the thickness of the adhesive interconnect layer 140 in the region where the area contacting the first insulation layer 110-IL1 is large. Thus, even when the second base substrate 120-BS is restored after being deformed, the change in thickness of the adhesive interconnect layer 140 is reduced, so that the influence on the first insulation layer 110-IL1 may be reduced. Therefore, the electronic device according to the embodiment of the inventive concept further includes the stress relaxation pad SPD, thereby easily solving the delamination in the display panel 110 and improving the reliability of the electronic device.

Meanwhile, as illustrated in FIG. 6C, an electronic device 100-S may further include a solder resist layer SRP. The solder resist layer SRP is disposed on the second base substrate 120-BS which is a flexible wiring substrate 122 in FIG. 2 to expose the output pads OPD-120, alignment pads APD-120, and stress relaxation pad SPD of the flexible circuit board 120. Although not illustrated, the circuit wirings connected to the output pads OPD-120 may be covered by the solder resist layer SRP. Thus, it is possible to prevent a short circuit caused by the adhesive interconnect layer 140, and to stably protect the circuit wirings, thereby improving the reliability of the electronic device 100-S.

Figure 8A:
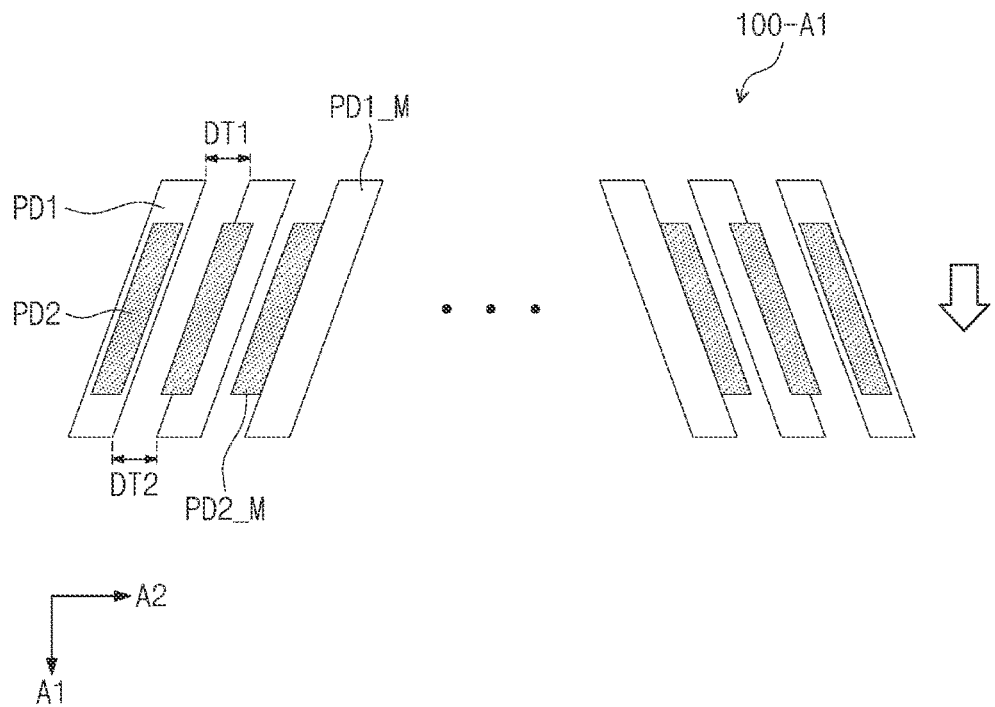
FIG. 8A illustrates a first alignment state of an electronic device according to an embodiment of the inventive concept.
Figure 8B:
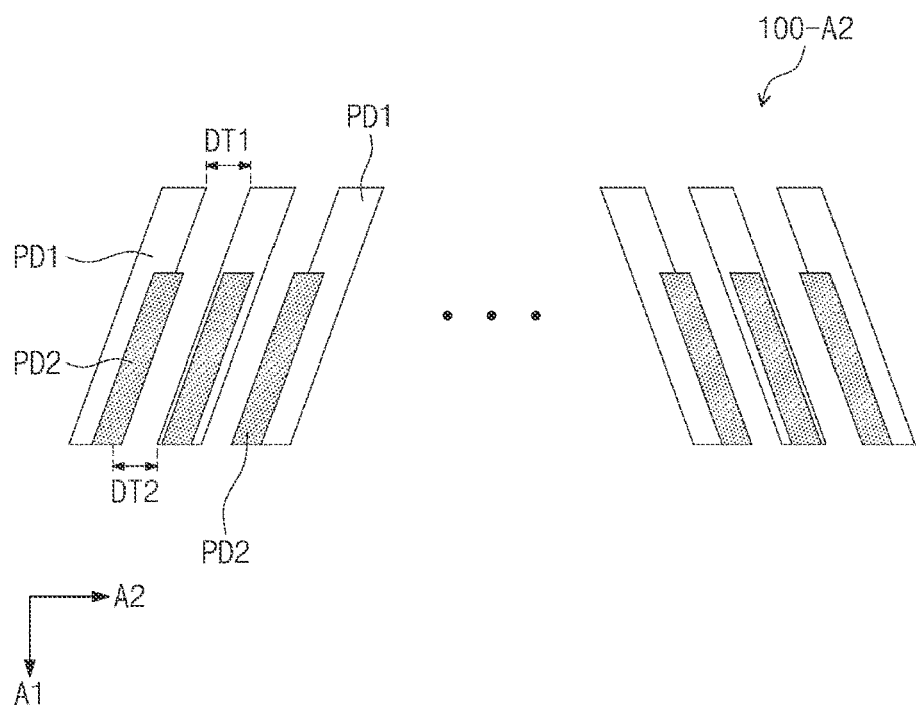
FIG. 8B illustrates a second alignment state of an electronic device illustrated in FIG. 8A.
Figure 9A:
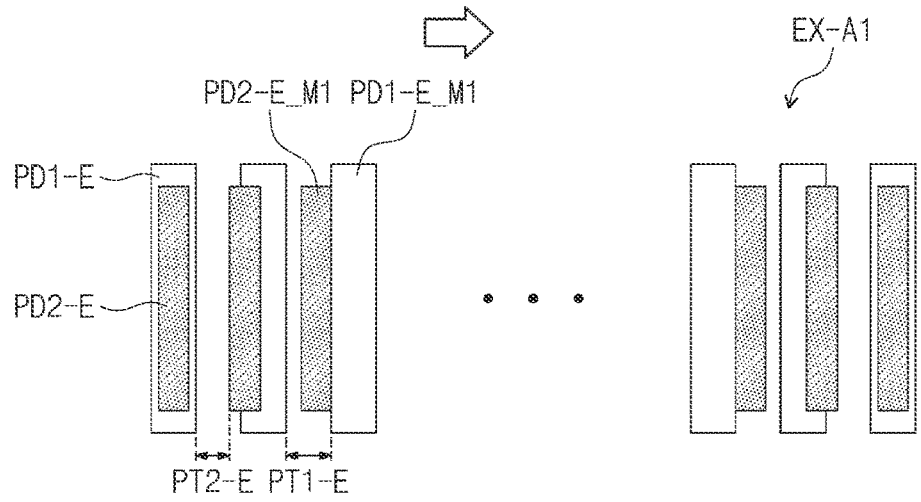
FIG. 9A illustrates a third alignment state of an electronic device according to a comparative example.
Figure 9A:
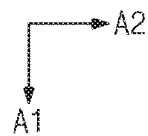

FIG. 8A illustrates a first alignment state of an electronic device according to an embodiment of the inventive concept, and FIG. 8B illustrates a second alignment state of the electronic device illustrated in FIG. 8A. FIG. 9A illustrates a third alignment state of an electronic device according to a comparative example, and FIG. 9B illustrates a fourth alignment state of an electronic device according to a comparative example.

Figure 9B:
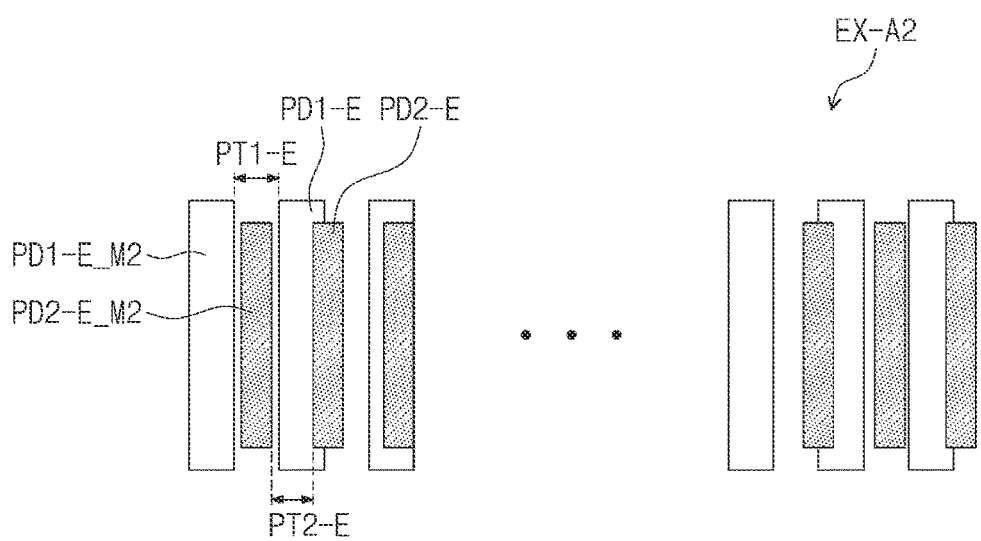
FIG. 9B illustrates a fourth alignment state of an electronic device according to a comparative example.
Figure 9B:
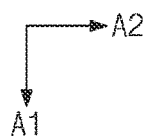

FIG. 8A and FIG. 8B illustrate only some of panel pads PD1 and output pads PD2 for easy explanation, and FIG. 9A and FIG. 9B illustrate only some of comparison panel pads PD1-E and comparison output pads PD2-E so as to correspond to those in FIG. 8A and FIG. 8B, respectively.

The comparative panel pads PD1-E and the comparative output pads PD2-E in the comparative examples EX-A1 and EX-A2 illustrated FIG. 9A and FIG. 9B may correspond to the panel pads PD1 and the output pads PD2 illustrated in FIG. 8A and FIG. 8B, except for having a shape extending in a parallel direction rather than in an oblique direction with respect to the first direction A1. Hereinafter, the electronic device according to an embodiment of the inventive concept will be described with reference to FIG. 8A to FIG. 9B.

In an electronic device 100-A1 in a first alignment state illustrated in FIG. 8A, some of the pads may be in a misalignment state. When the first alignment state is a process state in which the panel pads PD1 spaced by the first interval DT1 and the output pads PD2 spaced by a second interval DT2 different from the first interval DT1 are aligned, it is illustrated that certain panel pads PD1-M among the panel pads PD1 and certain output pads PD2-M among the output pads PD2 are not superimposed in a plan view.

Even when considering that the certain panel pads PD1-M and the certain output pads PD2-M are spaced apart from or brought into simple contact with each other, the resistance between the certain panel pads PD1-M and the certain output pads PD2-M is very large, so that the certain panel pads PD1-M and the certain output pads PD2-M may be substantially recognized as being in a misalignment state in which electrical connection is not achieved.

The second alignment state of the electronic device 100-A2 illustrated in FIG. 8B may be a process state in which the misalignment state of the electronic device 100-A1 in the first alignment state illustrated in FIG. 8A is corrected. When the output pads PD2 are moved in a direction parallel to the first direction A1 along the arrow direction, the certain panel pads PD1-M and the certain output pads PD2-M misaligned with each other in FIG. 8A may overlap each other. Accordingly, all pads of the electronic device 100-A2 in the second alignment state may be recognized as being in the alignment state in which all the pads are connected to each other.

Referring to FIG. 9A and FIG. 9B, when the third alignment state of the comparative example EX-A1 is a process state in which the panel pads PD1-E spaced by the first interval PT1-E and the output pads PD2-E spaced by the second interval PT2-E different from the first interval PT1-E are aligned, certain panel pads PD1-E_M1 and certain output pads PD2-E_M1 may appear as being in a misalignment state in which the certain panel pads PD1-E_M1 and the certain output pads PD2-E_M1 are not connected to each other.

Hereafter, the comparative example EX-A2 in a fourth alignment state will be described with reference to FIG. 9B. Even when the certain panel pads PD1-E_M1 and the certain output pads PD2-E_M1 are moved along the arrow direction from the third alignment state in the comparative example EX-A1 for electrical connection, other panel pads PD1-E_M2 and other output pads PD2-E_M2 may happen to be in a new misalignment state.

The panel pads PD1-E and the output pads PD2-E according to the comparative example have a shape extending in a parallel direction rather than in an oblique direction to the first direction A1, so that the movement in the first direction A1 has no influence on whether the panel pads PD1-E and the output pads PD2-E are connected to each other. In addition, the movement in the second direction A2 in a state in which each of the intervals between the panel pads PD1-E and the output pads PD2-E is fixed may cause new connection failures.

The electronic device according to an embodiment of the inventive concept includes the panel pads extending in an oblique direction, thereby enabling to more easily control the alignment process between the circuit board and the display panel, and to improve the bad connection problem. In particular, when the intervals between the panel pads and the output pads are different from each other, for example, even when a output pad interval changes due to a process error or deformation of a circuit board caused by heat in the thermo-compression bonding process, the existing connection process may be maintained without change, thereby reducing process costs and simplifying the process.

In addition, the electronic device according to an embodiment of the inventive concept includes a stress relaxation pad and alignment pads corresponding to output pads, so that even when pads are further added, influences such as the interference with the output pads and the panel pads may be reduced, and an easy design is possible.

Figure 10:
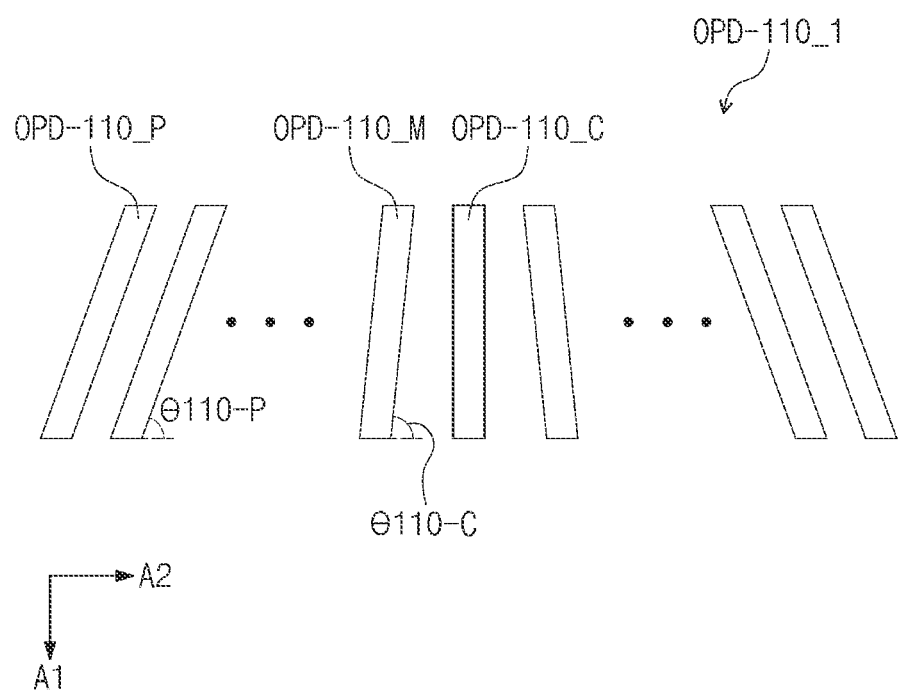
FIG. 10 is a plan view illustrating output pads according to an embodiment of the inventive concept.

FIG. 10 is a plan view illustrating output pads according to an embodiment of the inventive concept. As illustrated in FIG. 10, the output pads OPD-110_1 may include pads having different tilt angles.

FIG. 10 exemplarily illustrates a first pad OPD-110_C, a second pad OPD-110_M, and a third pad OPD-110_P.

The first pad OPD-110_C may be a pad disposed at the center. In this embodiment, the first pad OPD-110_C may be a pad disposed at a middle which is the center of the output pads OPD-110_1.

The first pad OPD-110_C may have a shape extending along the first direction A1. The pads arranged on the left side of the first pad OPD-110_C and the pads arranged on the right side of the first pad OPD-110_C may be arranged so that there is one line of symmetry. A line passing through a center of the first pad OPD-110_C may be a line of symmetry.

The second pad OPD-110_M may be disposed adjacent to the first pad OPD-110_C. The second pad OPD-110_M may extend in a direction inclined at a first angle θ110_C with respect to the second direction A2.

The third pad OPD-110_P may be disposed in the outermost side of the output pads OPD-110_1. The third pad OPD-110_P may extend in a direction inclined at a second angle θ110_P with respect to the second direction A2.

In this embodiment, as the output pads OPD-110_1 get closer to the outside from the center, that is, the farther away from the center along the second direction A2, the output pads OPD-110_1 may extend in an oblique direction inclined at a smaller angle with respect to the second direction A2. Accordingly, the second angle θ110_P may be smaller than the first angle θ110_C.

In this embodiment, the output pads OPD-110_1 may not be parallel to each other. Thus, the extended imaginary lines of the respective output pads OPD-110_1 may converge toward at least one convergence point.

The electronic device according to an embodiment of the inventive concept may include panel pads or output pads having various shapes and arrangements as along as the pads extend in an oblique direction with respect to the first direction A1 and the second direction A2, and the embodiment of the inventive concept is not limited to any one embodiment.

Figure 11A:
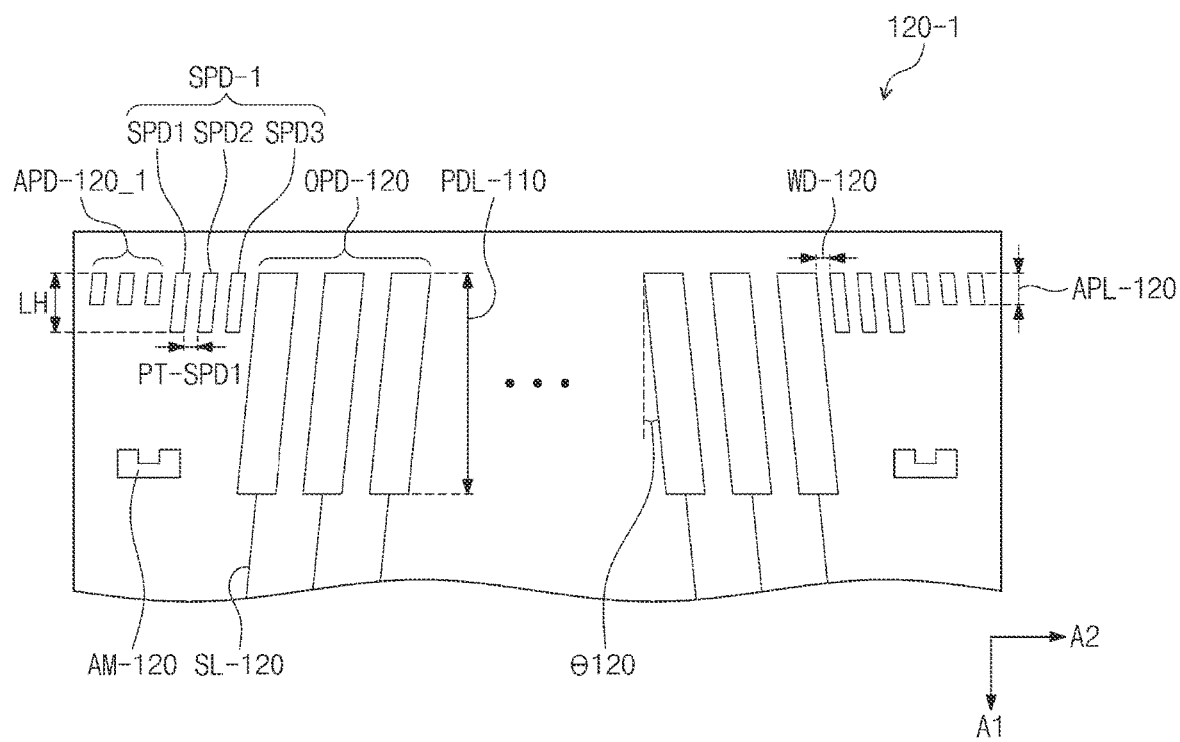
FIG. 11A is a plan view in which a part of the electronic device according to an embodiment of the inventive concept is separated.
Figure 11B:
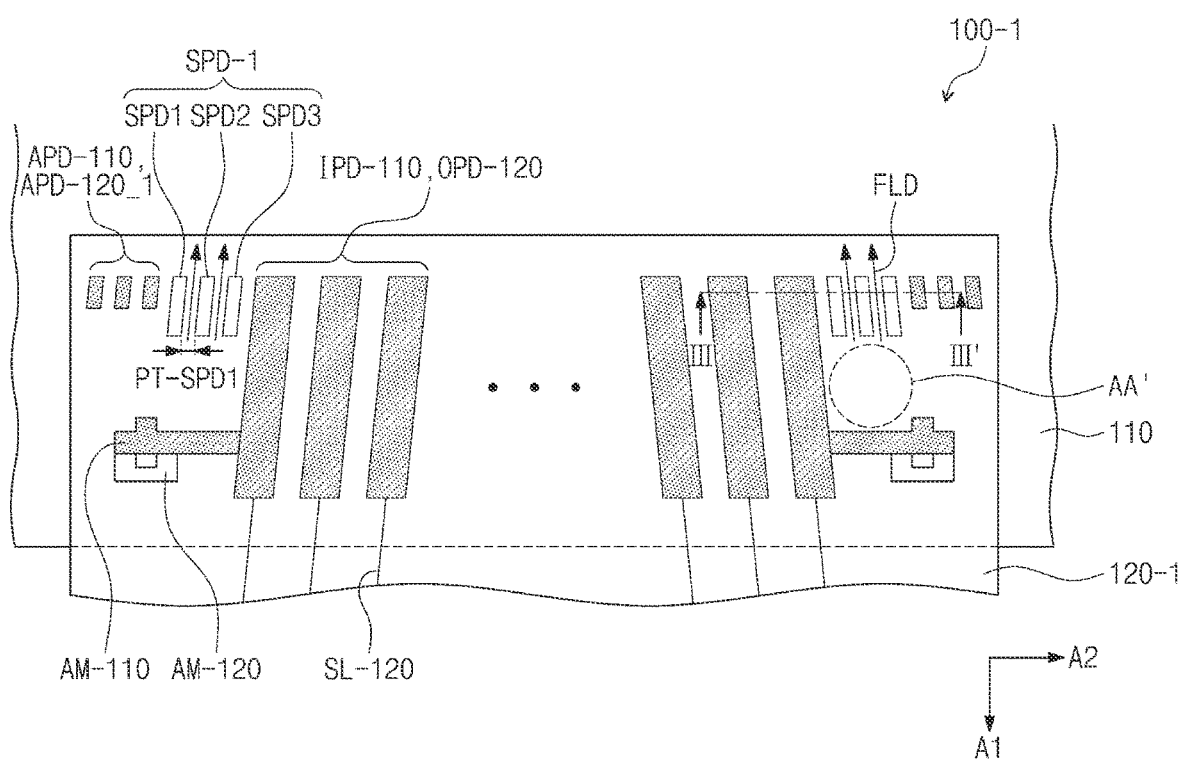
FIG. 11B is a plan view illustrating a part of the electronic device according to an embodiment of the inventive concept.
Figure 11C:
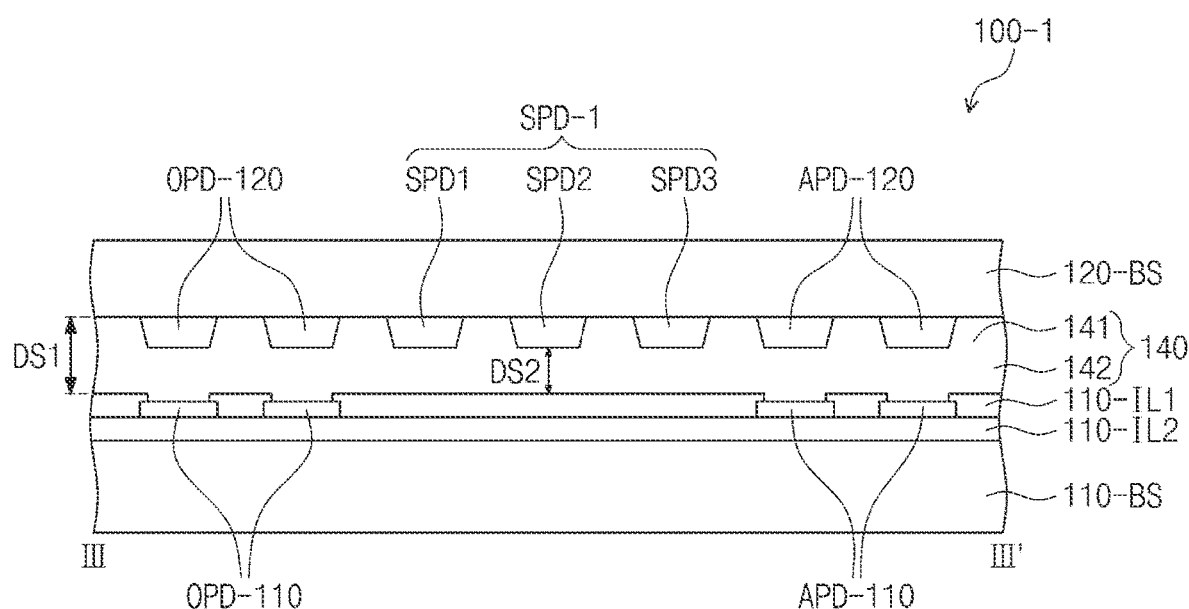
FIG. 11C is a cross-sectional view taken along line III-III' illustrated in FIG. 11B.

FIG. 11A is a plan view in which a part of an electronic device according to an embodiment of the inventive concept is separated, and FIG. 11B is a plan view illustrating a part of an electronic device according to an embodiment of the inventive concept, and FIG. 11C is a cross-sectional view taken along line III-III' illustrated in FIG. 11B. FIG. 11A exemplarily illustrates a part of the flexible circuit board 120-1 among the elements of the electronic device. Hereinafter, the electronic device according to an embodiment of the inventive concept will be described with reference to FIG. 11A to FIG. 11C. The same elements as those described in FIG. 1 to FIG. 10 will be denoted by the same numerals, and redundant description will not be provided herein.

As described in FIG. 11A, the electronic device may include a flexible circuit board 120-1 including a stress relaxation pad SPD-1. The stress relaxation pad SPD-1 may include a plurality of sub-pads.

In this embodiment, the sub-pads are exemplarily illustrated as first to third sub-pads SPD1, SPD2, and SPD3. The first to third sub-pads SPD1, SPD2, and SPD3 may be arranged apart from each other along the second direction A2.

In a plan view, the first to third sub-pads SPD1, SPD2, and SPD3 are spaced apart from the alignment pads APD-120_1 and the output pads OPD-120. The first to third sub-pads SPD1, SPD2, and SPD3 are illustrated to be spaced apart from the output pads OPD-120 by the second distance WD-120 in the second direction A2.

All of the first to third sub-pads SPD1, SPD2, and SPD3 are disposed in a space between the alignment pads APD-120_1 and the output pads OPD-120 which are spaced apart from each other. The widths or the intervals of the first to third sub-pads SPD1, SPD2, and SPD3 may be the same or different. In this embodiment, the first to third sub-pads SPD1, SPD2, and SPD3 are illustrated to have the same pitch PT-SPD1, but the embodiment is merely exemplarily illustrated, so that the first to third sub-pads SPD1, SPD2, and SPD3 may be arranged in various forms as long as being disposed in a space between the alignment pads APD-120_1 and the output pads OPD-120 which are spaced apart from each other.

The first to third sub-pads SPD1, SPD2, and SPD3 are disposed in a space between the alignment mark AM-120, the output pads OPD-120, and the alignment pads APD-120_1. Thus, the total width in the second direction A2 occupied by the first to third sub-pads SPD1, SPD2, and SPD3 may be equal to or less than a spaced distance between the alignment pads APD-120_1 and the output pads OPD-120 in the second direction A2.

The lengths of the first to third sub-pads SPD1, SPD2, and SPD3 in the first direction A1 may be limited to the length which allows the first to third sub-pads SPD1, SPD2, and SPD3 not to overlap the alignment mark AM-120. In particular, the length of the first to third sub-pads SPD1, SPD2, and SPD3 in the first direction A1 may be limited to the length which allows the first to third sub-pads SPD1, SPD2, and SPD3 not to overlap the panel alignment mark AM-110 in a plan view. In this embodiment, the length LH of each of the first to third sub-pads SPD1, SPD2, and SPD3 in the first direction A1 is larger than the length APL-120 of the alignment pads APD-120_1 in the first direction A1, and is smaller than the length PDL-110 of the output pads OPD-120 in the first direction A1.

The first to third sub-pads SPD1, SPD2, and SPD3 may have shapes corresponding to the adjacent pads. The first to third sub-pads SPD1, SPD2, and SPD3 may have a shape corresponding to at least any one of the alignment pads APD-120_1 and the output pads OPD-120. In this embodiment, the first to third sub-pads SPD1, SPD2, and SPD3 are exemplarily illustrated to have a shape and an arrangement similar to those of the alignment pads APD-120_1.

Hereafter, as illustrated in FIG. 11B and FIG. 11C, the flexible circuit board 120-1 is coupled to the display panel 110 through an arrangement step and a thermo-compression bonding step which are not illustrated. The output pads OPD-120 and the panel pads IPD-110 overlap each other in a plan view, and electrically connected through the adhesive interconnect layer 140.

The alignment pads APD-120_1 and the panel alignment pads APD-110 may overlap each other in a plan view to be aligned each other. In this embodiment, the alignment pads APD-120_1 may have the same length APL-120 as the panel alignment pads APD-110 in the first direction A1.

Accordingly, in the electronic device in which the flexible circuit board 120-1 and the display panel 110 are coupled, the alignment pads APD-120_1 may be illustrated to be completely overlap panel alignment pads APD-110 in a plan view. However, the embodiment is merely exemplarily illustrated, so that the alignment of the flexible circuit board 120-1 and the display panel 110 according to an embodiment of the inventive concept may be performed through various methods, and the embodiment of the inventive concept is not limited to any one embodiment.

In a plan view, the stress relaxation pad SPD-1 doesn't overlap any other pads. Thus, the first to third sub-pads SPD1, SPD2, and SPD3 may face the underlying second insulation layer 110-IL2 with the adhesive interconnect layer 140 interposed therebetween. The adhesive interconnect layer 140 may have a reduced thickness DS2 in the area in which the adhesive interconnect layer 140 overlap the first to third sub-pads SPD1, SPD2, and SPD3 in a plan view.

Referring to FIG. 11B, when connecting the flexible circuit board 120-1 and the display panel 110, a portion of the adhesive interconnect layer 140 disposed in a stress concentration area AA' surrounded by the panel alignment mark AM-110, the output pads OPD-120, and the stress relaxation pad SPD-1 may move between the first to third sub-pads SPD1, SPD2, and SPD3. Accordingly, the movement FLD of the adhesive interconnect layer 140 may occur between the first to third sub-pads SPD1, SPD2, and SPD3.

In this embodiment, since the stress concentration area AA' is surrounded by the panel alignment mark AM-110, the output pads OPD-120, and the stress relaxation pads SPD-1, the movement of the adhesive interconnect layer 140 may be occurred.

The electronic device 100-1 according to an embodiment of the inventive concept includes a stress relaxation pad SPD-1 including the first to third sub-pads SPD1, SPD2, and SPD3, thereby facilitating the movement of the adhesive interconnect layer 140 disposed in the stress concentration area AA'. Accordingly, delamination defects between the output pads OPD-120 and the alignment pads APD-120 may be reduced, and the biasing phenomenon of the adhesive interconnect layer 140 which may occur in the stress concentration area AA' may be also improved.

Figure 12:
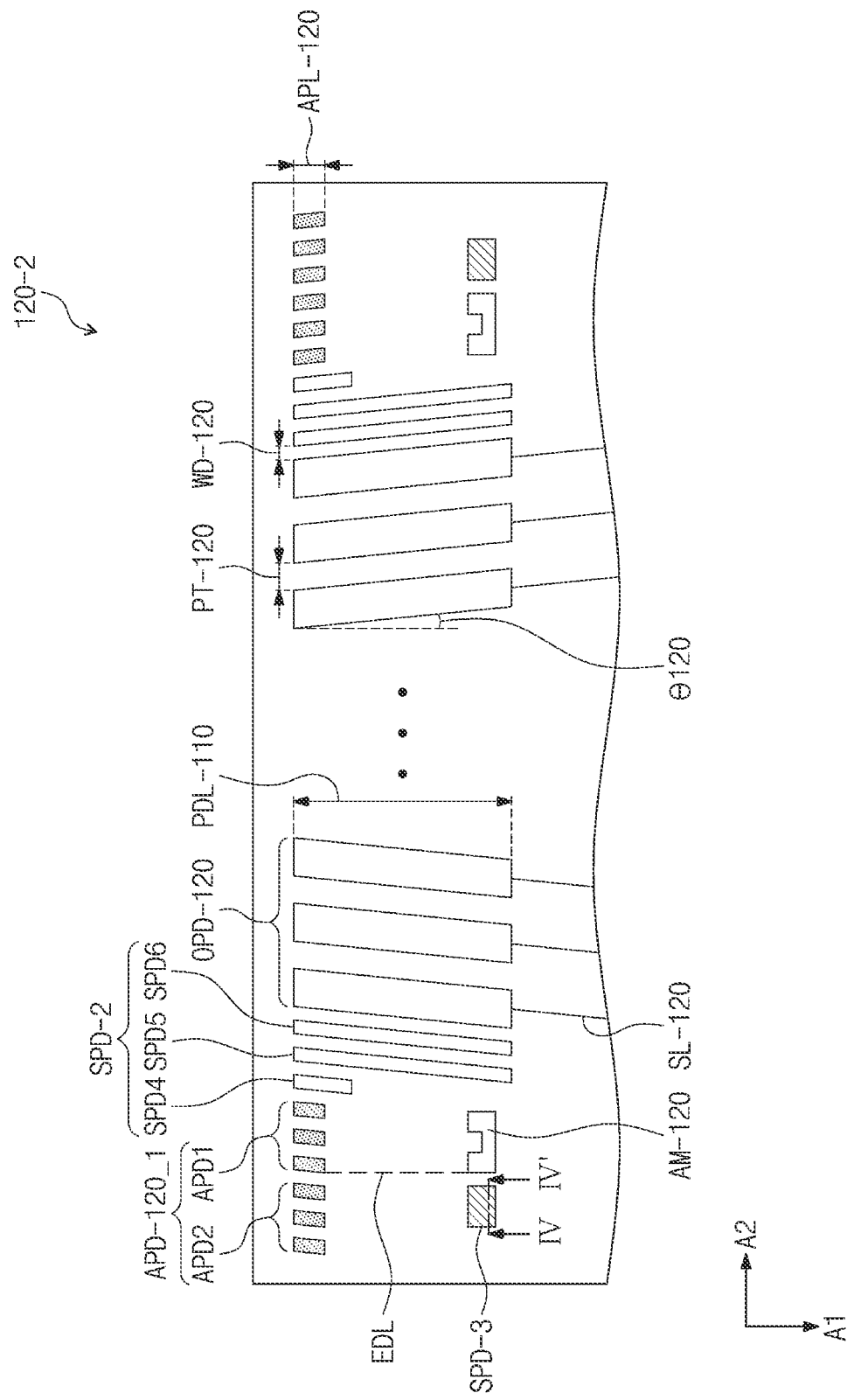
FIG. 12 is a plan view illustrating a part of the electronic device according to an embodiment of the inventive concept.
Figure 13A:
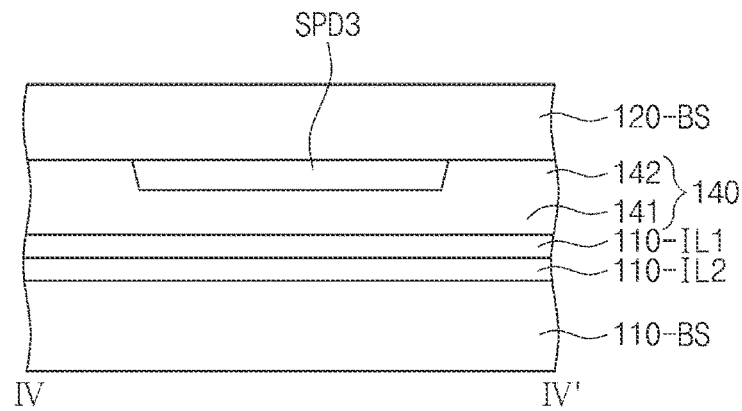
FIG. 13A is a cross-sectional view taken along line IV-IV' illustrated in FIG. 12.
Figure 13A:
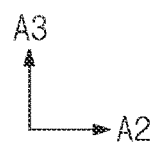
Figure 13B:
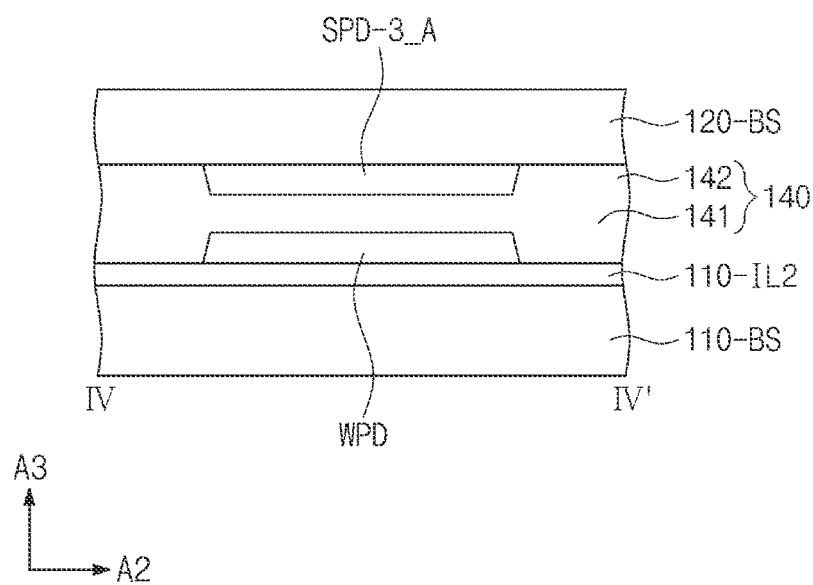
FIG. 13B is a cross-sectional view illustrating a part of the electronic device according to an embodiment of the inventive concept.
Figure 13B:
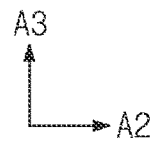

FIG. 12 is a plan view illustrating a part of the electronic device according to an embodiment of the inventive concept. FIG. 13A is a cross-sectional view taken along line IV-IV' illustrated in FIG. 12. FIG. 13B is a cross-sectional view illustrating a part of the electronic device according to an embodiment of the inventive concept. FIG. 12 illustrates a part of the flexible circuit board 120-2. FIG. 13A illustrates a part of the electronic device which includes the flexible circuit board 120-2 illustrated in FIG. 12, and corresponds to an area taken along line IV-IV'. FIG. 13B illustrates a partial area that corresponds to FIG. 13A and is of an electronic device according to an embodiment of the inventive concept. Hereinafter, the flexible circuit board 120-2 according to an embodiment of the inventive concept will be described with reference to FIG. 12. The same elements as those described in FIG. 1 to FIG. 11C will be denoted by the same numerals, and redundant description will not be provided herein.

As illustrated in FIG. 12, the flexible circuit board 120-2 may include a stress relaxation pad SPD-2 and an alignment pad APD-120_2 which are different from those of the flexible circuit board 120-1. The stress relaxation pad SPD-2 is exemplarily illustrated to have three sub-pads SPD4, SPD5, and SPD6. The sub-pads SPD4, SPD5, and SPD6 may be forth to sixth sub-pads SPD4, SPD5, and SPD6.

The forth to sixth sub-pads SPD4, SPD5, and SPD6 may have shapes different from each other. For example, the forth to sixth sub-pads SPD4, SPD5, and SPD6 may have different lengths in the first direction A1.

Among the forth to sixth sub-pads SPD4, SPD5, and SPD6, the fifth and sixth sub-pads SPD5 and SPD6, which are adjacent to the output pads OPD-120, have a shape relatively similar to those of the output pads OPD-120, and, among the forth to sixth sub-pads SPD4, SPD5, and SPD6, the fourth sub-pad SPD4 adjacent to the alignment pads APD-120_2 may have a shape relatively similar to those of the alignment pads APD-120_2.

Accordingly, it may be illustrated that the fifth and sixth sub-pads SPD5 and SPD6 have a length similar to the length PDL-110 in the first direction A1 of the output pad OPD-120, and the fourth sub-pad SPD4 has a smaller length than the length PDL-110. However, the embodiment is merely exemplarily illustrated, so that the fourth to sixth sub-pads SPD4, SPD5, and SPD6 may have various shapes, and the embodiment of the inventive concept is not limited to any one embodiment.

The alignment pads APD-120_2 may include first alignment pads APD1 and second alignment pads APD2. The first alignment pads APD1 may substantially correspond to the alignment pads APD-120_1 illustrated in FIG. 11A.

The second alignment pads APD2 are disposed adjacent to the first alignment pad APD1 in the second direction A2. The second alignment pads APD2 are illustrated to have a shape similar to the first alignment pads APD1. In this case, the second alignment pads APD2 may utilize the same design dimension as the first alignment pads APD1, so that the process may be simplified. However, the embodiment is merely exemplarily illustrated, so that the second alignment pads APD2 according to an embodiment of the inventive concept may have a shape different from the first alignment pads APD1, and the embodiment of the inventive concept is not limited to any one embodiment.

The second alignment pads APD2 may be disposed in the outside of an edge line EDL disposed between the first alignment pads APD1 and the second alignment pads APD2. The second alignment pads APD2 may reduce the alignment error of the flexible circuit board 120-2 to improve the preciseness in the connection process of the flexible circuit board 120-2. In addition, the second alignment pads APD2 may alleviate the lifting phenomenon of a second insulation layer 110-IL2 (see FIG. 11C), which may occur outside the edge line EDL.

Meanwhile, the flexible circuit board 120-2 according to an embodiment of the inventive concept may further include an additional stress relaxation pad SPD-3. The additional stress relaxation pad SPD-3 may be disposed outside the alignment mark AM-120. The additional stress relaxation pad SPD-3 is disposed outside the edge line EDL.

Referring to FIG. 13A, the additional stress relaxation pad SPD-3 doesn't overlap any other panel pads. The additional stress relaxation pad SPD-3 may directly face the first insulation layer 110-IL1 with the adhesive interconnect layer 140 interposed therebetween. The flexible circuit board 120-2 according to an embodiment of the inventive concept may further include a second alignment pads APD2 and an additional stress relaxation pad SPD-3, thereby easily preventing delamination between the first insulation layer 110-IL1 and the second insulation layer 110-IL2, which may occur in the end regions of the output pads.

Referring to FIG. 13B, the electronic device may include a window pad WPD disposed on the base substrate 110-BS. In this case, a portion of the first insulation layer 110-IL1 overlapping the window pad WPD may be removed. Accordingly, the window pad WPD is disposed on the second insulation layer 110-IL2.

The window pad WPD may include a metal. For example, the window WPD pad may be formed of the same material as the panel pads (not illustrated).

The window pad WPD may be disposed so as to overlap an additional stress relaxation pad SPD-3_A. The additional stress relaxation pad SPD-3_A may face the window pad WPD with the adhesive interconnect layer 140 disposed therebetween.

At least a portion of the conductive particles 141 in the adhesive interconnect layer 140 is disposed between the window pad WPD and the additional stress relaxation pad SPD-3_A, and thus may be compressed by the window pad WPD and the additional stress relaxation pad SPD-3_A. According to an embodiment of the inventive concept, it is possible to easily check whether the electrical connection is stably achieved between the panel pads and the output pads by means of the window pad WPD and the additional stress relaxation pad SPD-3_A.

In an embodiment of the inventive concept, a delamination phenomenon that may occur due to the difference in resilience between the electronic components after electrically connecting the electronic components by using the thermo-compression bonding may be alleviated. Further, since a pad structure capable of stably achieving the electrical connection is provided even when the electronic components or the like are deformed due to the thermo-compression bonding, a connection failure caused by the alignment error in the bonding process may be prevented.

Although the exemplary embodiments of the present inventive concept have been described, it is understood that the present inventive concept should not be limited to these exemplary embodiments but various changes and modifications can be made by one ordinary skilled in the art within the spirit and scope of the present inventive concept as hereinafter claimed.

Therefore, the technical scope of the present inventive concept should not be limited to the contents described in the detailed description of the specification, but should be defined by the claims.

What is claimed is:

1. An electronic device comprising:
a display panel including a display area, a peripheral area, and a pad area in a plan view, the display panel comprising:
a plurality of pixels disposed in the display area, and
a plurality of panel pads disposed in the pad area, the plurality of panel pads being spaced apart in a first direction from the plurality of pixels and each of the plurality of panel pads being arranged along a second direction crossing the first direction;
a circuit board, the circuit board comprising:
a plurality of output pads which are connected to the plurality of panel pads, respectively, and
an alignment pad spaced apart from the plurality of output pads along the second direction; and
a first pad spaced apart in the second direction from the plurality of output pads in a plan view and electrically insulated from the plurality of panel pads.

2. The electronic device of claim 1, wherein the plurality of output pads have predetermined extension angles with respect to the first direction and at least two pads among the plurality of output pads have different extension angles.

3. The electronic device of claim 1, wherein intervals of the plurality of panel pads become greater as distances from a center of the pad area increase.

4. The electronic device of claim 1, wherein intervals of the plurality of output pads are different according to distances from a center of the pad area.

5. The electronic device of claim 1, wherein the first pad is disposed between the plurality of output pads and the alignment pad in a plan view.

6. The electronic device of claim 1, wherein each of the plurality of output pads extends obliquely with respect to the first direction and the second direction, and the plurality of output pads are arranged along the second direction.

7. The electronic device of claim 1, wherein a length of the first pad in the first direction is greater than or equal to a length of the alignment pad in the first direction and is less than or equal to lengths of the plurality of output pads in the first direction.

8. The electronic device of claim 7, wherein the display panel further comprises an additional alignment pad disposed on a base substrate on which the plurality of panel pads are disposed and spaced apart from the alignment pad in the first direction, and
wherein the first pad is spaced apart from the alignment pad, the output pad, and the additional alignment pad in a plan view.

9. The electronic device of claim 1, wherein the plurality of output pads overlap the plurality of panel pads in a plan view and the first pad is spaced apart from the plurality of panel pads in a plan view.

10. The electronic device of claim 9, further comprising an adhesive interconnect layer disposed between the display panel and the circuit board, and electrically connecting the display panel and the circuit board.

11. The electronic device of claim 10, wherein the plurality of panel pads are disposed between a base substrate and a first insulation layer, and
wherein the adhesive interconnect layer is in contact with the first insulation layer in an area in which the adhesive interconnect layer is superimposed on the first pad.

12. The electronic device of claim 11,
wherein at least a portion of the plurality of panel pads are partially exposed by the first insulation layer, and
wherein the adhesive interconnect layer comprises:
an adhesive layer, and
a plurality of conductive particles dispersed in the adhesive layer, and
wherein the adhesive layer and the first insulation layer are in contact with each other in an area in which the adhesive interconnect layer is superimposed on the first pad.

13. The electronic device of claim 11, further comprising a second insulation layer disposed between the first insulation layer and the base substrate,
wherein an adhesive force between the first insulation layer and the adhesive interconnect layer is greater than an adhesive force between the first insulation layer and the second insulation layer.

14. The electronic device of claim 1, wherein the first pad is disposed on a flexible substrate.

15. The electronic device of claim 14, wherein the display panel further comprises a second pad spaced apart from the plurality of panel pads and overlap the first pad in a plan view.

16. The electronic device of claim 15, wherein the plurality of panel pads are disposed between a base substrate and a first insulation layer, and wherein a portion of the first insulation layer overlapping the second pad is removed.

17. The electronic device of claim 1, further comprising alignment mark which is spaced apart in the first direction and electrically insulated from the plurality of panel pads.

18. The electronic device of claim 17, wherein the alignment mark is connected to a pad disposed in the outermost side among the plurality of output pads.

19. The electronic device of claim 17, wherein the first pad comprises a plurality of sub-pads which are spaced apart from each other along the second direction.

20. The electronic device of claim 19, wherein the sub-pads extend in a direction crossing the plurality of output pads.

21. The electronic device of claim 19, wherein the sub-pads extend in a direction parallel to the plurality of output pads.

22. The electronic device of claim 21, wherein the sub-pads extend in a direction parallel to the output pad closest to the sub-pads among the plurality of output pads.

23. The electronic device of claim 19, wherein a length of the sub-pads in the first direction allows the sub-pads not to overlap the alignment mark.

24. The electronic device of claim 23, wherein the length of the sub-pads in the first direction is larger than a length of the alignment pad in the first direction and the length of the sub-pads in the first direction is smaller than each length of the plurality of output pads in the first direction.

25. The electronic device of claim 24, wherein the sub-pads comprises a first sub-pad disposed adjacent to the alignment pad, a second sub-pad, and a third sub-pad disposed adjacent to the plurality of output pads, the second sub-pad being disposed between the first sub-pad and the second sub-pad, and wherein a shape of the first sub-pad is different from shapes of the second pad and the third sub-pad.

26. The electronic device of claim 25, wherein the shape of the first sub-pad is similar to a shape of the alignment pads.

27. The electronic device of claim 25, wherein a length of the second sub-pad and a length of the third sub-pad are similar to a length of the plurality of output pads, and wherein a length of the first sub-pad is smaller than the length of the second sub-pad and the third sub-pad.

* * * * *